(12) United States Patent
Im et al.

(10) Patent No.: US 12,300,766 B2
(45) Date of Patent: May 13, 2025

(54) LED DISPLAY DEVICE WHERE ANODE AND CATHODE ELECTRODES IN EACH PIXEL HAVE DIFFERENT WITDTHS

(71) Applicant: Samsung Display Co., LTD., Yongin-si (KR)

(72) Inventors: Hyun Deok Im, Seoul (KR); Jong Hyuk Kang, Suwon-si (KR); Dae Hyun Kim, Hwaseong-si (KR); Won Hee Nam, Hwaseong-si (KR); Ki Sun Jang, Yongin-si (KR); Hyun Min Cho, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 563 days.

(21) Appl. No.: 17/614,724

(22) PCT Filed: May 20, 2020

(86) PCT No.: PCT/KR2020/006568
§ 371 (c)(1),
(2) Date: Nov. 29, 2021

(87) PCT Pub. No.: WO2020/242116
PCT Pub. Date: Dec. 3, 2020

(65) Prior Publication Data
US 2022/0223760 A1 Jul. 14, 2022

(30) Foreign Application Priority Data
May 29, 2019 (KR) .......................... 10-2019-0063375

(51) Int. Cl.
*H01L 33/38* (2010.01)
*H01L 27/15* (2006.01)

(52) U.S. Cl.
CPC ............ *H01L 33/38* (2013.01); *H01L 27/156* (2013.01)

(58) Field of Classification Search
CPC .............................. H01L 33/38; H01L 27/156
(Continued)

(56) References Cited

U.S. PATENT DOCUMENTS 10,607,968 B2  3/2020  Woo et al.
11,094,678 B2  8/2021  Woo et al.
(Continued)

FOREIGN PATENT DOCUMENTS

JP     2006-319229    11/2006
KR  10-2013-0073013     7/2013
(Continued)

OTHER PUBLICATIONS

Extended European Search Report for European Application No. 20814981.5, dated May 11, 2023.
(Continued)

*Primary Examiner* — Phuc T Dang
(74) *Attorney, Agent, or Firm* — KILE PARK REED & HOUTTEMAN PLLC

(57) ABSTRACT

A display device includes at least one pixel; at least one electrode spaced apart from each other in each of the at least one pixel; and at least one light-emitting element disposed between the at least one electrode, wherein the at least one electrode include at least one inner electrode disposed adjacent to the center of each of the at least one pixel; and at least one outer electrode spaced apart from each of the at least one inner electrode, a distance between the central portion of the at least one pixel and the at least one outer electrode is greater than a distance between the central portion of the at least one pixel and the inner electrode, and
(Continued)

a width of the at least one inner electrode is different from a width of the at least one outer electrode.

15 Claims, 19 Drawing Sheets

(58) Field of Classification Search
USPC .......................................................... 257/99
See application file for complete search history.

(56) References Cited

U.S. PATENT DOCUMENTS

| | | |
|---|---|---|
| 11,756,938 B2 | 9/2023 | Woo et al. |
| 2010/0053528 A1* | 3/2010 | Li ..................... G02F 1/134309 349/124 |
| 2014/0284588 A1 | 9/2014 | Takeuchi |
| 2018/0019369 A1 | 1/2018 | Cho et al. |
| 2019/0043844 A1 | 2/2019 | Liu et al. |
| 2019/0096858 A1 | 3/2019 | Woo et al. |
| 2021/0328098 A1 | 10/2021 | Takeya et al. |

FOREIGN PATENT DOCUMENTS

| | | | | |
|---|---|---|---|---|
| KR | 10-2015-0006798 | | 1/2015 | |
| KR | 10-2016-0072010 | | 6/2016 | |
| KR | 10-2018-0072909 | | 7/2018 | |
| KR | 10-2019-0014480 | | 2/2019 | |
| KR | 10-2019-0034379 | | 4/2019 | |
| KR | 20200022061 A | * | 3/2020 | ............. H01L 33/38 |
| WO | WO-2007086520 A1 | * | 8/2007 | ............. H01L 51/52 |
| WO | WO-2013035575 A | * | 3/2013 | ........... H10K 59/122 |
| WO | 2019/027248 X | | 2/2019 | |
| WO | 20100012287 A | * | 3/2020 | ............. H01L 33/38 |

OTHER PUBLICATIONS

International Search Report, with English translation, corresponding to International Application No. PCT/KR2020/006568 dated Sep. 1, 2020.

Written Opinion, with English translation, corresponding to International Application No. PCT/KR2020/006568, dated Sep. 1, 2020.

* cited by examiner

FIG. 1
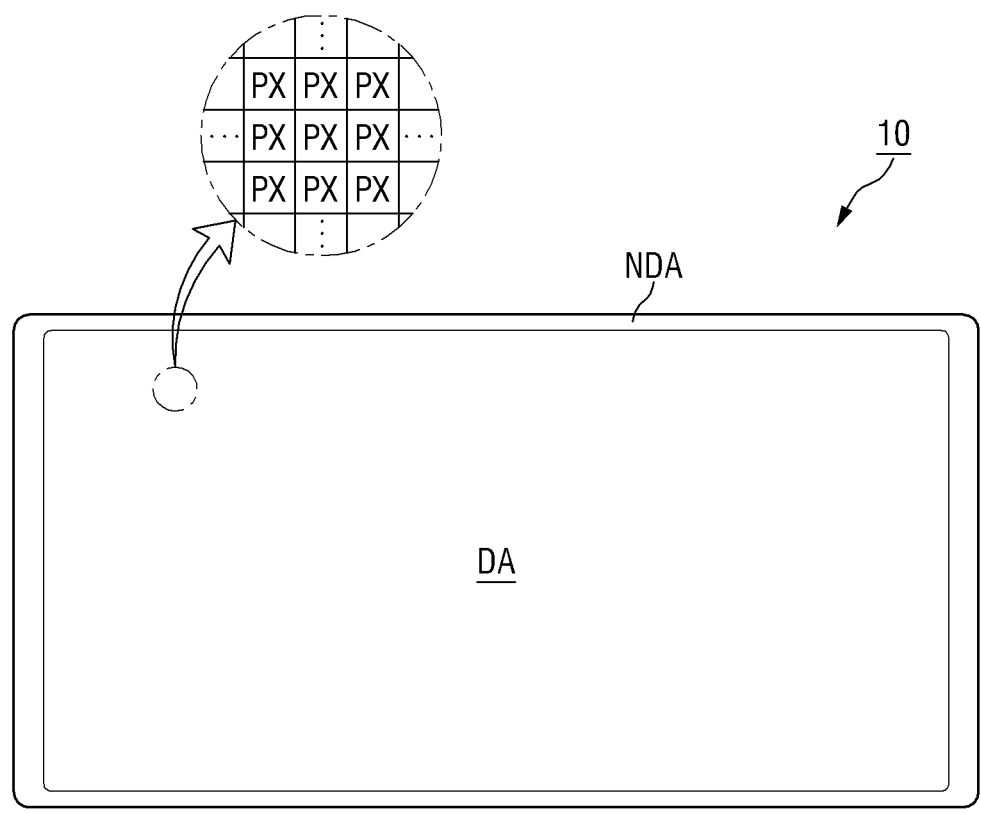
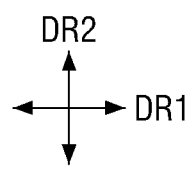

LED DISPLAY DEVICE WHERE ANODE AND CATHODE ELECTRODES IN EACH PIXEL HAVE DIFFERENT WITDTHS

CROSS-REFERENCE TO RELATED APPLICATION(S)

This application is a national entry of International Application No. PCT/KR2020/006568, filed on May 20, 2020, which claims under 35 U.S.C. §§ 119(a) and 365(b) priority to and benefits of Korean Patent Application No. 10-2019-0063375, filed on May 29, 2019, in the Korean Intellectual Property Office (KIPO), the entire contents of which are incorporated herein by reference.

BACKGROUND

1. Technical Field

The disclosure relates to a display device, and more particularly, to a display device including electrodes having different widths.

2. Description of Related Art

Display devices are becoming increasingly important with the development of multimedia. Accordingly, various types of display devices such as organic light emitting displays and liquid crystal displays are being used.

A display device includes a display panel such as an organic light emitting display panel or a liquid crystal display panel as a device for displaying an image of the display device. Among them, a light emitting display panel may include light-emitting elements such as light emitting diodes (LEDs). For example, the LEDs may be organic light emitting diodes (OLEDs) using an organic material as a fluorescent material or may be inorganic LEDs using an inorganic material as a fluorescent material.

Inorganic LEDs using an inorganic semiconductor as a fluorescent material are durable even in a high-temperature environment and have higher blue light efficiency than OLEDs. In addition, a transfer method using dielectrophoresis (DEP) has been developed for a manufacturing process which has been pointed out as a limitation of conventional inorganic LEDs. Therefore, research is being continuously conducted on inorganic LEDs having better durability and efficiency than OLEDs.

SUMMARY

Aspects of the disclosure provide a display device including a plurality of electrodes having different widths and light-emitting elements disposed between the electrodes.

Aspects of the disclosure also provide a display device in which light-emitting elements disposed between electrodes have a uniform distribution.

It should be noted that aspects of the disclosure are not limited thereto and other aspects, which are not mentioned herein, will be apparent to those of ordinary skill in the art from the following description.

According to an embodiment of the disclosure, a display device may include at least one pixel, at least one electrode spaced apart from each other in each of the at least one pixel, and at least one light-emitting element disposed between the at least one electrode. The at least one electrode may include at least one inner electrode disposed adjacent to a central portion of the at least one pixel, and at least one outer electrode spaced apart from each of the at least one inner electrode. A distance between the central portion of the at least one pixel and the at least one outer electrode may be greater than a distance between the central portion of the at least one pixel and the at least one inner electrode, and a width of the at least one inner electrode may be different from a width of the at least one outer electrode.

The display device may further comprise a bank disposed between the at least one pixel and surrounding the inner electrode and the at least one outer electrode, a plurality of alignment regions between a central portion of the at least one inner electrode and a central portion of the at least one outer electrode and in which the at least one light-emitting element is disposed, and a non-alignment region between the bank and the central portion of the at least one outer electrode. A width of each of the plurality of alignment regions may be greater than a width of the non-alignment region.

A distance between the bank and the at least one outer electrode may be less than a distance between the outer electrode and the central portion of the at least one pixel.

The at least one light-emitting element may have a shape extending in a direction, and a distance between the at least one inner electrode and the at least one outer electrode may be less than a length of the at least one light-emitting element measured in the direction.

A distance between the at least one inner electrode may be equal to the distance between the at least one inner electrode and the at least one outer electrode, and the at least one light-emitting element may be also disposed between the at least one inner electrode.

The width of the at least one inner electrode may be greater than the width of the at least one outer electrode.

The at least one inner electrode may include a first inner electrode, and a second inner electrode spaced apart from the first inner electrode, and the first inner electrode and the second inner electrode may be spaced apart from each other based on the central portion of the at least one pixel.

The first inner electrode and the second inner electrode may have a same width.

The at least one inner electrode may include a third inner electrode having a central portion colinear with the central portion of a corresponding one of the at least one pixel and a plurality of fourth inner electrodes spaced apart from sides of the third inner electrode, and a width of the third inner electrode and a width of each of the plurality of fourth inner electrodes may be different from each other.

The width of each of the plurality of fourth inner electrodes may be greater than the width of the at least one outer electrode and may be less than the width of the third inner electrode.

According to an embodiment of the disclosure, a display device comprises a first bank and a second bank that are disposed on a substrate and spaced apart from a center of the substrate, at least one first electrode and at least one second electrode spaced apart from each other between the first and second banks, and at least one light-emitting element disposed between the at least one first electrode and the at least one second electrode. A width of the at least one first electrode and a width of the at least one second electrode may be different from each other.

The at least one first electrode and the at least one second electrode may be disposed between the first bank and the center of the substrate, the at least one first electrode may be disposed between the at least one second electrode and the bank, and the width of the at least one second electrode may be greater than the width of the at least one first electrode.

A distance between a central portion of the at least one first electrode and the bank may be less than a distance between the central portion of the at least one first electrode and a central portion of the at least one second electrode.

A first separation distance (WD) between the at least one first electrode and the bank, and a second separation distance (WA) between the at least one first electrode and the at least one second electrode may be defined as Equation 1 below, $$WD < WA + WE/2 \qquad \text{[Equation 1]}$$

where, WD is the first separation distance between the at least one first electrode and the bank, WA is the second separation distance between the at least one first electrode and the at least one second electrode, and WE is the width of the at least one first electrode or the at least one second electrode).

The display device may further comprise a third electrode spaced apart from the at least one second electrode with respect to the center of the substrate, the at least one second electrode and the third electrode having a same width, and a fourth electrode disposed between the third electrode and the second bank and spaced apart from the third electrode, the at least one first electrode and the fourth electrode having a same width.

A central portion of the at least one second electrode may be colinear with the center of the substrate, the at least one first electrode may be disposed between the at least one second electrode and the first bank, and the width of the at least one second electrode may be greater than the width of the at least one first electrode.

A distance between the first bank and a central portion of the at least one first electrode may be less than a distance between the central portion of the at least one first electrode and the central portion of the at least one second electrode.

According to an embodiment of the disclosure, a display device may comprise a plurality of banks each extending in a first direction and spaced apart from each other in a second direction different from the first direction, at least one first electrode extending in the first direction between the banks, at least one second electrode spaced apart from the at least one first electrode in the second direction, and at least one light-emitting element disposed between the at least one first electrode and the at least one second electrode. A width of the at least one first electrode and a width of the at least one second electrode are different from each other, and a distance between a central portion of the at least one first electrode and a central portion of the at least one second electrode may be greater than a distance between the at least one first electrode and a corresponding one of the plurality of banks.

The at least one first electrode may be spaced apart from sides of the at least one second electrode, and the width of the at least one second electrode is greater than the width of the at least one first electrode.

A distance between the at least one first electrode and sides of the at least one second electrode may be less than a length of the at least one light-emitting element.

The details of other embodiments are included in the detailed description and the accompanying drawings.

A display device according to an embodiment can include electrodes having different widths. Accordingly, the number of light-emitting elements disposed in a region other than a space between the electrodes can be minimized, and light-emitting elements disposed between the plurality of electrodes can have a uniform distribution.

The effects according to the embodiments are not limited by the contents exemplified above, and more various effects are included in this disclosure.

BRIEF DESCRIPTION OF THE DRAWINGS

An additional appreciation according to the embodiments of the disclosure will become more apparent by describing in detail the embodiments thereof with reference to the accompanying drawings, wherein:

FIG. 1 is a schematic plan view of a display device according to an embodiment.

DETAILED DESCRIPTION OF THE EMBODIMENTS

Figure 2:
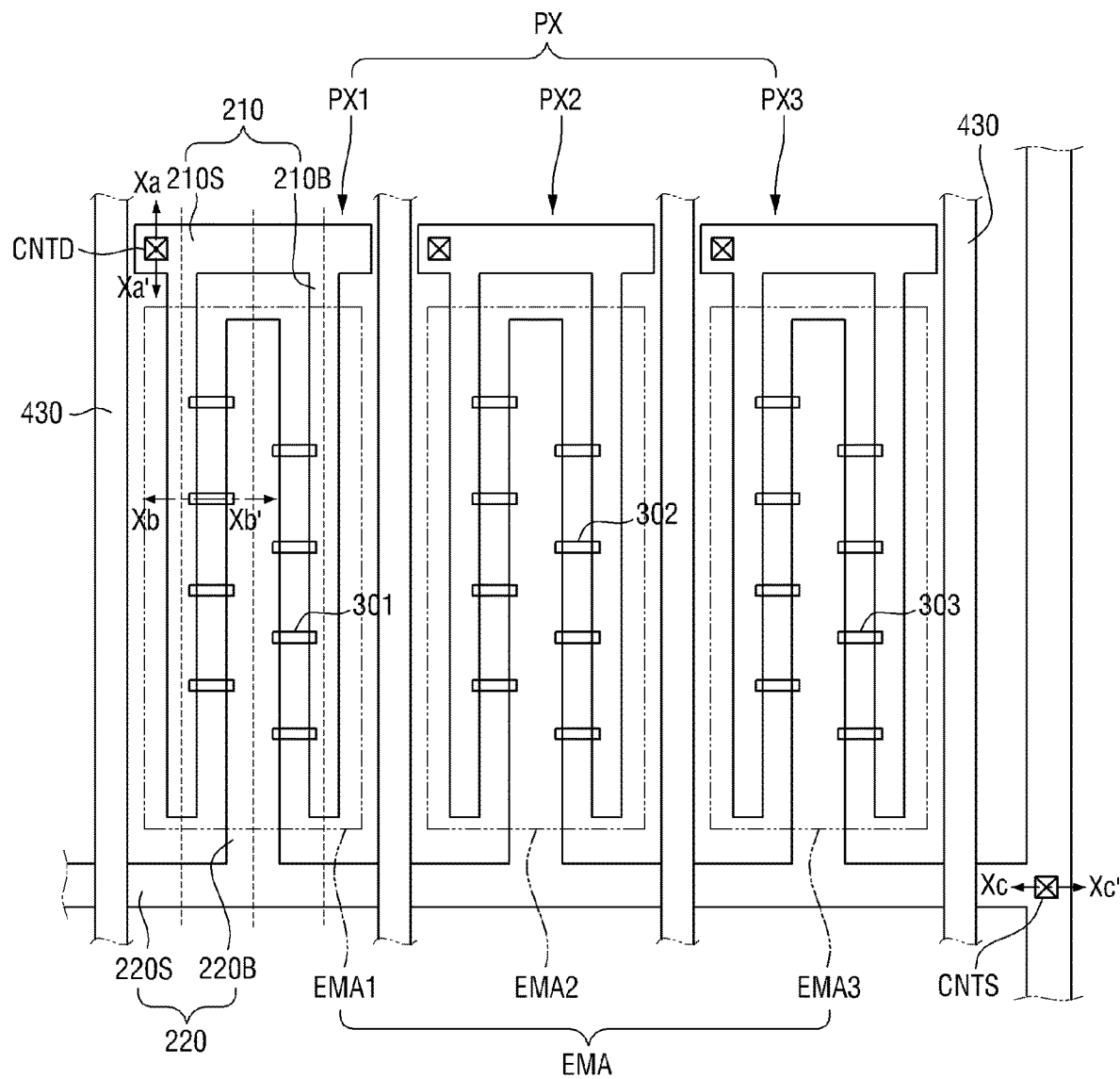
FIG. 2 is a schematic plan view of a pixel of the display device according to an embodiment.

The disclosure will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be thorough and complete, and will convey the scope of the disclosure to those skilled in the art.

It will also be understood that when a layer is referred to as being "on" another layer or substrate, it can be directly on the other layer or substrate, or intervening layers may also be. The same reference numbers indicate the same components throughout the specification.

It will be understood that, although the terms "first," "second," and the like may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

It will be understood that the terms "contact," "connected to," and "coupled to" may include a physical and/or electrical contact, connection, or coupling.

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, embodiments will be described with reference to the accompanying drawings.

FIG. 1 is a schematic plan view of a display device according to an embodiment.

Referring to FIG. 1, a display device 10 displays a video or a still image. The display device 10 may refer to all electronic devices that provide display screens. For example, the display device 10 may include a television, a laptop, a monitor, an advertising board, an Internet of Things (IoT) device, a mobile phone, a smartphone, a tablet personal computer (PC), an electronic watch, a smartwatch, a watch phone, a head-mounted display, a mobile communication terminal, an electronic organizer, an electronic book reader, a portable multimedia player (PMP), a navigation device, a game machine, a digital camera, a camcorder, and the like, which provide display screens.

The display device 10 includes a display panel that provides a display screen. Examples of the display panel may include a light-emitting diode (LED) display panel, an organic light-emitting display panel, a quantum dot light-emitting display panel, a plasma display panel, a field emission display panel, and the like. Hereinafter, although an example in which the LED display panel is applied as an example of the display panel is described, the disclosure is not limited thereto, and when the same technical spirit is applicable, it may be applied to other display panels.

A shape of the display device 10 may be variously modified. For example, the display device 10 may have shapes such as a rectangular shape of which lateral sides are long, a rectangular shape of which longitudinal sides are long, a square shape, a quadrangular shape of which corner portions (vertexes) are round, other polygonal shapes, a circular shape, and the like. A shape of a display region DA of the display device 10 may also be similar to an overall shape of the display device 10. In FIG. 1, the display device 10 and the display region DA, which have the rectangular shape of which lateral sides are long, are illustrated.

The display device 10 may include the display region DA and a non-display region NDA. The display region DA is a region in which an image may be displayed, and the non-display region NDA is a region in which an image is not displayed. The display region DA may also be referred to as an active region, and the non-display region NDA may also be referred to as an inactive region.

The display region DA may generally occupy a center of the display device 10. The display region DA may include pixels PX. The pixels PX may be arranged in a matrix form. A shape of each of the pixels PX may be a rectangular shape or a square shape in a plan view, but is not limited thereto, and may be a rhombic shape of which sides are inclined with respect to a first direction DR1. Each of the pixels PX may include one or more light-emitting elements 300, which emit light in a specific wavelength band, to display a specific color.

FIG. 2 is a schematic plan view of a pixel of the display device according to an embodiment.

Referring to FIG. 2, each of the pixels PX may include a first sub-pixel PX1, a second sub-pixel PX2, and a third sub-pixel PX3. The first sub-pixel PX1 may emit light of a first color, the second sub-pixel PX2 may emit light of a second color, and the third sub-pixel PX3 may emit light of a third color. The first color may be a blue color, the second color may be a green color, and the third color may be a red color, but the disclosure is not limited thereto, and each of the sub-pixels PXn may emit light of a same color, where n is a natural number. in FIG. 2, the pixel PX is illustrated as including three sub-pixels PXn, but the disclosure is not limited thereto, and the pixel PX may include a greater number of sub-pixels PXn.

Each of the sub-pixels PXn of the display device 10 may include a region that is defined as a light-emitting region EMA. The first sub-pixel PX1 may include a first light-emitting region EMA1, the second sub-pixel PX2 may include a second light-emitting region EMA2, and the third sub-pixel PX3 may include a third light-emitting region EMA3. The light-emitting region EMA may be defined as a region in which the light-emitting elements 300 included in the display device 10 are disposed to emit light in a specific wavelength band. Each of the light-emitting elements 300 includes an active layer 330, and the active layer 330 may emit light in a specific wavelength band without directivity. For example, the light emitted from the active layer 330 of the light-emitting element 300 may also be emitted in directions toward side surfaces of the light-emitting element 300 including both end portions thereof. The light-emitting region EMA of each sub-pixel PXn may include a region in which the light-emitting element 300 is disposed and a region in which the light emitted from the light-emitting element 300 is emitted to a region adjacent to the light-emitting element 300. However, the disclosure is not limited thereto, and the light-emitting region EMA may also include a region in which the light emitted from the light-emitting element 300 is reflected or refracted by another member to be emitted. Light-emitting elements 300 may be disposed in each sub-pixel PXn, and the region in which the light-emitting elements 300 are disposed and a region adjacent to the region form the light-emitting region EMA.

Although not shown in the drawings, each of the sub-pixels PXn of the display device 10 may include a non-light-emitting region that is defined as a region other than the light-emitting region EMA. The non-light-emitting region may be defined as a region in which the light-emitting elements 300 are not disposed and which the light emitted by the light-emitting elements 300 does not reach so that light is not emitted.

Figure 3:
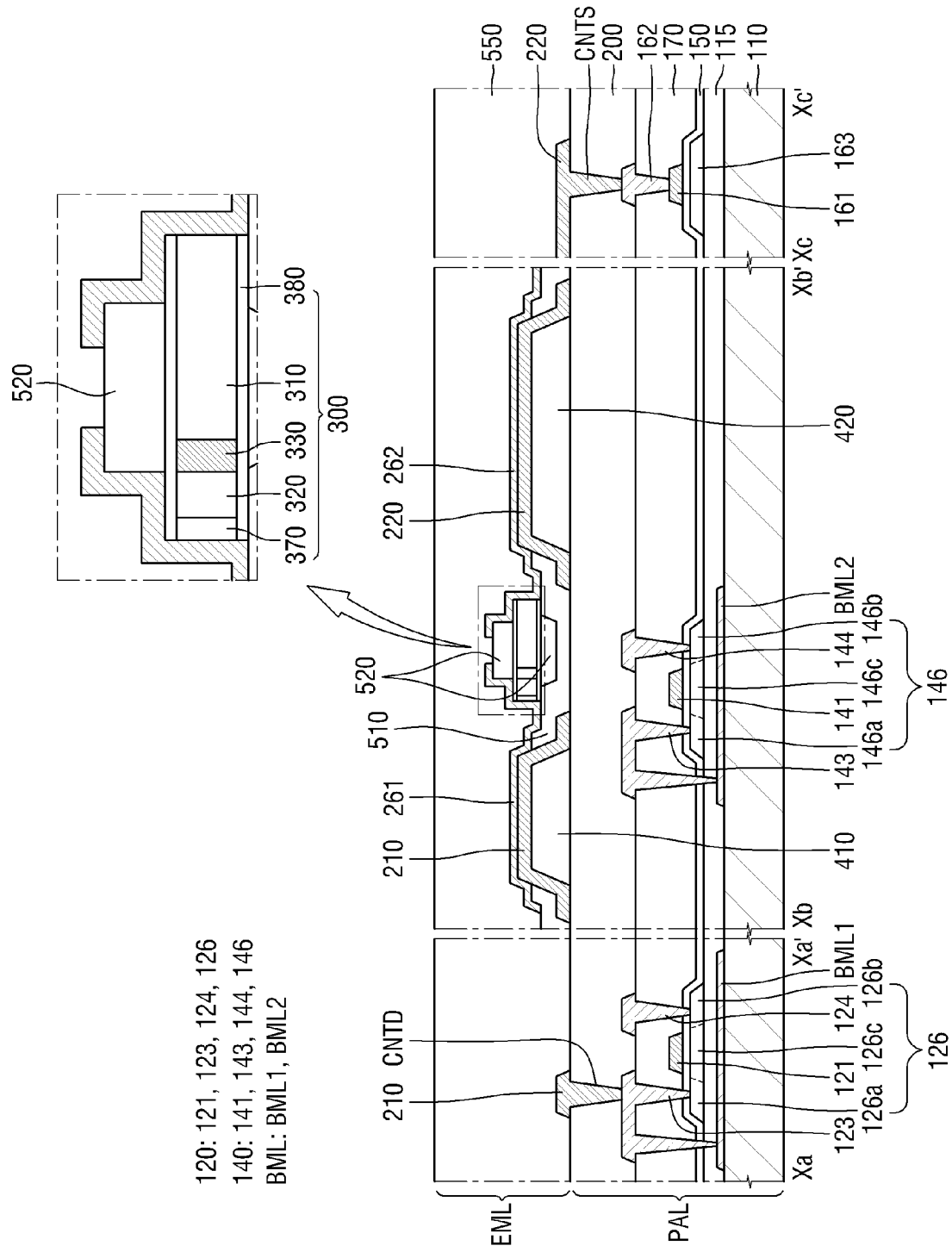
FIG. 3 is a schematic cross-sectional view taken along lines Xa-Xa', Xb-Xb', and Xc-Xc' of FIG. 2.

Each sub-pixel PXn of the display device 10 may include electrodes 210 and 220, the light-emitting elements 300, banks 410, 420, and 430 (shown in FIG. 3), and at least one insulating layer 510, 520, or 550 (shown in FIG. 3).

The electrodes 210 and 220 may be electrically connected to the light-emitting elements 300 and may receive a predetermined voltage so as to allow the light-emitting elements 300 to emit light in a specific wavelength band. Further, at least a portion of each of the electrodes 210 and 220 may be utilized to form an electric field in the sub-pixel PXn, thereby aligning the light-emitting elements 300.

The electrodes 210 and 220 may include a first electrode 210 and a second electrode 220. In an embodiment, the first electrode 210 may be a pixel electrode separated for each sub-pixel PXn, and the second electrode 220 may be a common electrode electrically connected in common along each sub-pixel PXn. One of the first electrode 210 and the second electrode 220 may be an anode of the light-emitting element 300, and the other thereof may be a cathode of the light-emitting element 300. However, the disclosure is not limited thereto, and the reverse of the above description may be possible.

The first electrode 210 and the second electrode 220 may respectively include electrode stem portions 210S and 220S extending in the first direction DR1 and one or more electrode branch portions 210B and 220B that extend and branch from the electrode stem portions 210S and 220S in a second direction DR2 that is a direction intersecting (or crossing) the first direction DR1.

The first electrode 210 may include a first electrode stem portion 210S extending in the first direction DR1, and at least one first electrode branch portion 210B branching from the first electrode stem portion 210S to extend in the second direction DR2.

The first electrode stem portion 210S of an arbitrary pixel may have both ends that are spaced apart and terminated between the sub-pixels PXn and may be substantially collinear with the first electrode stem portion 210S of an adjacent sub-pixel in the same row (e.g., adjacent in the first direction DR1). Both ends of the first electrode stem portions 210S disposed in each sub-pixel PXn may be spaced apart from each other so that different electrical signals may be applied to the first electrode branch portions 210B, and the first electrode branch portions 210B may be individually driven.

The first electrode branch portion 210B may branch from at least a portion of the first electrode stem portion 210S, may extend in the second direction DR2, and may be terminated in a state of being spaced apart from a second electrode stem portion 220S that is disposed to face the first electrode stem portion 210S.

The second electrode 220 may include the second electrode stem portion 220S that extends in the first direction DR1 and is spaced apart from the first electrode stem portion 210S in the second direction DR2 to face the first electrode stem portion 210S, and a second electrode branch portion 220B that branches from the second electrode stem portion 220S and extends in the second direction DR2. The other end portion of the second electrode stem portion 220S may be connected to a second electrode stem portion 220S of another sub-pixel PXn that is adjacent in the first direction DR1. For example, unlike the first electrode stem portion 210S, the second electrode stem portion 220S may extend in the first direction DR1 to cross each sub-pixel PXn. The second electrode stem portion 220S intersecting each sub-pixel PXn may be connected to an outer portion of the display region DA, in which each pixel PX or each sub-pixel PXn is disposed, or connected to a portion extending from the non-display region NDA in a direction.

The second electrode branch portion 220B may be spaced apart from and face the first electrode branch portion 210B and may be terminated in a state of being spaced apart from the first electrode stem portion 210S. The second electrode branch portion 220B may be connected to the second electrode stem portion 220S, and an end portion of the second electrode branch portion 220B in an extending direction may be disposed in the sub-pixel PXn in a state of being spaced apart from the first electrode stem portion 210S.

According to an embodiment, the first electrode 210 and the second electrode 220 may have different widths. The first electrode 210 and the second electrode 220 are disposed in a sub-pixel, and the light-emitting elements 300 are disposed between the first and second electrodes 210 and 220. Each sub-pixel PXn of the display device 10 may have a constant width, and a region in which the light-emitting elements 300 are disposed and a region in which the light-emitting elements 300 are not disposed may be defined in each sub-pixel PXn. The light-emitting elements 300 are disposed between a first electrode 210 or a first electrode branch portion 210B and a second electrode 220 or a second electrode branch portion 220B, and may not be disposed in the other regions, which are between each of the electrodes 210 and 220 and an outer bank 430.

Figure 7:
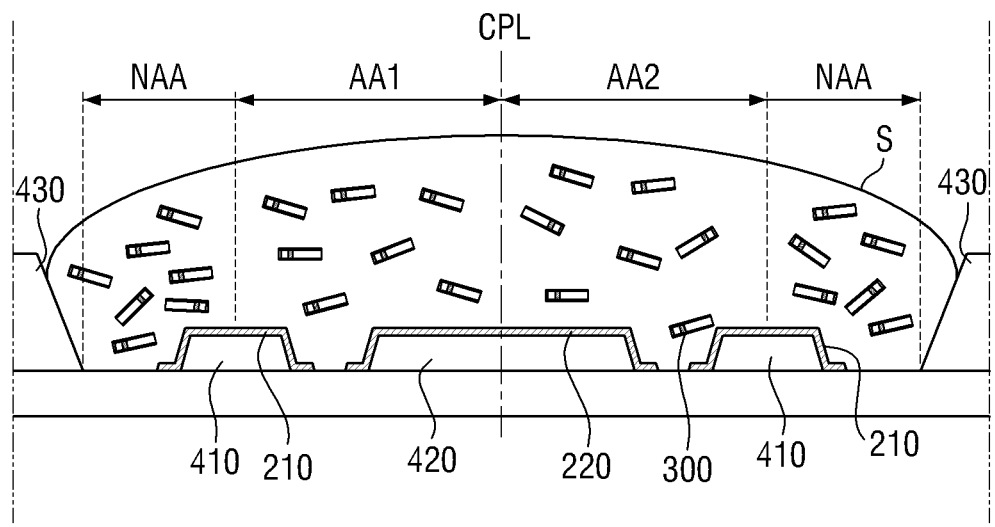
FIGS. 7 and 8 are schematic views illustrating a state in which ink including light-emitting elements dispersed therein is sprayed onto the sub-pixel of the display device according to an embodiment.

During the process of manufacturing the display device 10, the light-emitting elements 300 may be sprayed onto the electrodes 210 and 220 in a state of being dispersed in ink S (shown in FIG. 7). The light-emitting elements 300 have a uniform distribution in the ink S, and thus the number of the light-emitting elements 300 to be disposed may be determined according to an area or volume of the region defined in the sub-pixel PXn. Here, in case that a distance (or separation distance) between each of the electrodes 210 and 220 and the outer bank 430, which is the region in which the light-emitting elements 300 are not disposed, is greater than a region between the electrodes 210 and 220, which is the region in which the light-emitting elements 300 are disposed, a great number of light-emitting elements 300 may be located between the electrodes 210 and 220 and the outer bank 430. Furthermore, in case that a greater number of electrodes 210 and 220 are disposed in each sub-pixel PXn, the light-emitting elements 300 may be non-uniformly distributed in each region between the electrodes 210 and 220. In order to prevent this, the display device 10 according to an embodiment includes the first electrode 210 and the second electrode 220 having different widths and may induce so that a great number of light-emitting elements 300 may be disposed between the first and second electrodes 210 and 220. A more detailed description thereof will be made below with reference to other drawings.

The first electrode 210 and the second electrode 220 may each be electrically connected to a circuit element layer PAL (shown in FIG. 3) of the display device 10 through contact holes, e.g., a first electrode contact hole CNTD and a second electrode contact hole CNTS. In the drawing, the first electrode contact hole CNTD is illustrated as being formed in the first electrode stem portion 210S of each of the sub-pixels PXn, and only a second electrode contact hole CNTS is illustrated as being formed in a second electrode stem portion 220S intersecting each sub-pixel PXn. However, the disclosure is not limited thereto, and in some cases (or in some embodiments), the second electrode contact hole CNTS may be formed in each sub-pixel PXn.

In the drawing, two first electrode branch portions 210B are illustrated as being disposed in each sub-pixel PXn, and a second electrode branch portion 220B is illustrated as being disposed between the two first electrode branch portions 210B, but the disclosure is not limited thereto. Further, the first electrode 210 and the second electrode 220 do not necessarily have a shape extending in a direction and may be disposed in various structures (without extending in a direction). For example, the first electrode 210 and the second electrode 220 may each have a partially curved or bent shape, and one of the first electrode 210 and the second electrode 220 may be disposed to surround the other electrode. The structure or shape of the first electrode 210 and the second electrode 220 may not be particularly limited as long as at least some regions of the first electrode 210 and the second electrode 220 are spaced to face each other to form a space in which the light-emitting element 300 will be disposed therebetween.

Further, in some embodiments, the electrode stem portions 210S and 220S may be respectively omitted from the first electrode 210 and the second electrode 220. The first electrode 210 and the second electrode 220 may have only a shape extending in a direction and may disposed to be spaced apart from each other in each sub-pixel PXn. This will be described below with reference to other embodiments.

The banks 410, 420, and 430 may include the outer bank 430 disposed at a boundary between the sub-pixels PXn, and inner banks 410 and 420 disposed below the electrodes 210 and 220 adjacent to a central portion of each sub-pixel PXn. Although inner banks 410 and 420 are not illustrated in the drawings, a first inner bank 410 and a second inner bank 420 may be respectively disposed below the first electrode branch portion 210B and the second electrode branch portion 220B. A description thereof will be made below with reference to other drawings.

The outer bank 430 may be disposed at the boundary between the sub-pixels PXn. End portions of first electrode stem portions 210S may be spaced apart from each other and terminated based on the outer bank 430. The outer bank 430 may extend in the second direction DR2 and may be disposed at the boundary between the sub-pixels PXn arranged in the first direction DR1. However, the disclosure is not limited thereto, and the outer bank 430 may extend in the first direction DR1 and may also be disposed at the boundary between the sub-pixels PXn arranged in the second direction DR2. The outer bank 430 and the inner banks 410 and 420 may include the same material and may be simultaneously formed by a process.

The light-emitting elements 300 may be disposed between the first electrode 210 and the second electrode 220. As shown in the drawings, the light-emitting elements 300 may be disposed between the first electrode branch portion 210B and the second electrode branch portion 220B. One end portion (or first end portion) of each of at least some of the light-emitting elements 300 may be electrically connected to the first electrode 210, and another end portions (or second portion) of each of at least some of the light-emitting elements 300 may be electrically connected to the second electrode 220. Both end portions of the light-emitting element 300 may be respectively placed on the first electrode branch portion 210B and the second electrode branch portion 220B, but the disclosure is not limited thereto. In some cases, the light-emitting element 300 may be disposed between the first electrode 210 and the second electrode 220 such that both end portions thereof do not overlap the first electrode 210 and the second electrode 220.

The light-emitting elements 300 are disposed to be spaced apart from each other between the electrodes 210 and 220 and may be aligned substantially parallel to each other. A separation distance between the light-emitting elements 300 is not particularly limited. In some cases, the light-emitting elements 300 may be disposed adjacent to each other to form a group, and other light-emitting elements 300 may form a group in a state of being spaced apart therefrom at predetermined intervals, may have a non-uniform density, and may be oriented and aligned in a direction. Further, in an embodiment, the light-emitting element 300 may have a shape extending in a direction, and a direction in which each electrode, e.g., each of the first electrode branch portion 210B and the second electrode branch portion 220B, extends may be substantially perpendicular to a direction in which the light-emitting element 300 extend. However, the disclosure is not limited thereto, and the light-emitting element 300 may be obliquely disposed without being perpendicular to the direction in which the first electrode branch portion 210B and the second electrode branch portion 220B extend.

The light-emitting elements 300 according to an embodiment may include active layers 330 having different materials to emit light in different wavelength bands to the outside. The display device 10 according to an embodiment may include the light-emitting elements 300 emitting light in different wavelength bands. The display device 10 may include a first light-emitting element 301 disposed in the first sub-pixel PX1, a second light-emitting element 302 disposed in the second sub-pixel PX2, and a third light-emitting element 303 disposed in the third sub-pixel PX3.

The first light-emitting element 301, the second light-emitting element 302, and the third light-emitting element 303 and the light-emitting element 300 of FIG. 1 may have a same structure, and may include different active layers 330. The first light-emitting element 301 may include the active layer 330 emitting first light having a central wavelength band of a first wavelength, and the second light-emitting element 302 may include the active layer 330 emitting second light having a central wavelength band of a second wavelength, and the third light-emitting element 303 may include the active layer 330 emitting third light having a central wavelength band of a third wavelength.

Thus, the first light may be emitted from the first sub-pixel PX1, the second light may be emitted from the second sub-pixel PX2, and the third light may be emitted from the third sub-pixel PX3. In some embodiments, the display device 10 may include light-emitting elements including active layers 330 emitting light of different colors, for example, a first light-emitting element 301, a second light-emitting element 302, and a third light-emitting element 303. The first light-emitting element 301, the second light-emitting element 302, and the third light-emitting element 303 may include active layers 330 emitting first light, second light, and third light, respectively.

In some embodiments, the first light may be blue light having a central wavelength band ranging from about 450 nm to about 495 nm, the second light may be green light having a central wavelength band ranging from about 495 nm to about 570 nm, and the third light may be red light having a central wavelength band ranging from about 620 nm to about 752 nm. However, the disclosure is not limited thereto. The first light, the second light, and the third light may be light of different colors or light of the same color, but the central wavelength bands may be different from the above ranges. Therefore, the detailed descriptions thereof will be omitted.

Further, although not shown in FIG. 2, the display device 10 may include a first insulating layer 510 that covers (or overlaps) at least some portions of the first electrode 210 and the second electrode 220.

The first insulating layer 510 may be disposed in each sub-pixel PXn of the display device 10. The first insulating layer 510 may be disposed to substantially cover the entirety of each sub-pixel PXn and extend even to other adjacent sub-pixels PXn. The first insulating layer 510 may be disposed to cover at least some portions of the first electrode 210 and the second electrode 220. Although not shown in FIG. 2, the first insulating layer 510 may be disposed to expose some portions of the first electrode 210 and the second electrode 220, specifically, some regions of the first electrode branch portion 210B and the second electrode branch portion 220B.

In addition to the first insulating layer 510, the display device 10 may include the circuit element layer PAL located below each of the electrodes 210 and 220, a second insulating layer 520 (shown in FIG. 3) disposed to cover at least a portion of each of the electrodes 210 and 220 and the light-emitting element 300, and a passivation layer 550 (shown in FIG. 3). Hereinafter, the structure of the display device 10 will be described in detail with reference to FIG. 3.

FIG. 3 is a schematic cross-sectional view taken along lines Xa-Xa', Xb-Xb', and Xc-Xc' of FIG. 2.

FIG. 3 illustrates only a cross section of the first sub-pixel PX1, but the cross section may be identically applied to other pixels PX or sub-pixels PXn. FIG. 3 illustrates a cross section intersecting an end portion and the other end portion of an arbitrary light-emitting element 300.

Referring to FIGS. 2 and 3, the display device 10 may include a circuit element layer PAL and a light-emitting layer EML. The circuit element layer PAL may include a substrate 110, a buffer layer 115, a light-blocking layer BML, first and second transistors 120 and 140, and the like, and the light-emitting layer EML may include the electrodes 210 and 220, the light-emitting element 300, the insulating layers 510, 520, and 550, and the like that are disposed on the first and second transistors 120 and 140.

The substrate 110 may be an insulating substrate. The substrate 110 may be made of an insulating material such as glass, quartz, a polymer resin, or the like. The substrate 110 may be a rigid substrate but may also be a flexible substrate that is bendable, foldable, rollable, or the like.

The light-blocking layer BML may be disposed on the substrate 110. The light-blocking layer BML may include a first light-blocking layer BML1 and a second light-blocking layer BML2. The first light-blocking layer BML1 may be electrically connected to a first drain electrode 123 of the first transistor 120, which will be described below. The second light-blocking layer BML2 may be electrically connected to a second drain electrode 143 of the second transistor 140.

The first light-blocking layer BML1 and the second light-blocking layer BML2 are respectively disposed to overlap a first active material layer (or first active layer) 126 of the first transistor 120 and a second active material layer (or second active material layer) 146 of the second transistor 140. The first and second light-blocking layers BML1 and BML2 may include light-blocking materials to prevent light from being incident on the first and second active material layers 126 and 146. As an example, the first and second light-blocking layers BML1 and BML2 may be formed of opaque metal materials that block light transmission. However, the disclosure is not limited thereto, and in some cases, the light-blocking layer BML may be omitted.

The buffer layer 115 is disposed on the light-blocking layer BML and the substrate 110. The buffer layer 115 may be disposed to cover (or overlap) the entirety of the substrate 110, including the light-blocking layer BML. The buffer layer 115 may prevent diffusion of impurity ions, prevent permeation of moisture or external air, and perform a surface planarization function. The buffer layer 115 may insulate the light-blocking layer BML from the first and second active material layers 126 and 146.

A semiconductor layer is disposed on the buffer layer 115. The semiconductor layer may include the first active material layer 126 of the first transistor 120, the second active material layer 146 of the second transistor 140, and an auxiliary layer 163. The semiconductor layer may include polycrystalline silicon, monocrystalline silicon, an oxide semiconductor, or the like.

The first active layer 126 may include a first doped region 126a, a second doped region 126b, and a first channel region 126c. The first channel region 126c may be disposed between the first doped region 126a and the second doped region 126b. The second active layer 146 may include a third doped region 146a, a fourth doped region 146b, and a second channel region 146c. The second channel region 146c may be disposed between the third doped region 146a and the fourth doped region 146b. The first active layer 126 and the second active layer 146 may include polycrystalline silicon. The polycrystalline silicon may be formed by crystallizing amorphous silicon. Examples of the crystallization method may include a rapid thermal annealing (RTA) method, a solid phase crystallization (SPC) method, an excimer laser annealing (ELA) method, a metal-induced crystallization (MILC) method, and a sequential lateral solidification (SLS) method, and the like, but the disclosure is not limited thereto. As another example, the first active material layer 126 and the second active material layer 146 may include monocrystalline silicon, low-temperature polycrystalline silicon, amorphous silicon, or the like. The first doped region 126a, the second doped region 126b, the third doped region 146a, and the fourth doped region 146b may be regions in which some regions of the first active material layer 126 and the second active material layer 146 are doped with impurities. However, the disclosure is not limited thereto.

However, the first active material layer 126 and the second active material layer 146 are not necessarily limited to the above description. In an embodiment, the first active material layer 126 and the second active material layer 146 may include an oxide semiconductor. In this case, the first doped region 126a and the third doped region 146a may be first conductorized regions, and the second doped region 126b and the fourth doped region 146b may be second conductorized regions. In case that the first active material layer 126 and the second active material layer 146 include an oxide semiconductor, the oxide semiconductor may be an oxide semiconductor containing indium (In). In some embodiments, the oxide semiconductor may include indium-tin oxide (ITO), indium-zinc oxide (IZO), indium-gallium oxide (IGO), indium-zinc-tin oxide (IZTO), indium-gallium-tin oxide (IGTO), indium-gallium-zinc oxide (IGZO), indium-gallium-zinc-tin oxide (IGZTO), or the like. However, the disclosure is not limited thereto.

A first gate insulating film 150 is disposed on the semiconductor layer. The first gate insulating film 150 may be disposed to cover (or overlap) the entirety of the buffer layer 115 and the semiconductor layer. The first gate insulating film 150 may serve as gate insulating films of the first and second transistors 120 and 140.

A first conductive layer is disposed on the first gate insulating film 150. On the first gate insulating film 150, the first conductive layer may include a first gate electrode 121 disposed on the first active material layer 126 of the first transistor 120, a second gate electrode 141 disposed on the second active material layer 146 of the second transistor 140, and a power line 161 disposed on the auxiliary layer 163. The first gate electrode 121 may overlap the first channel region 126c of the first active material layer 126, and the second gate electrode 141 may overlap the second channel region 146c of the second active material layer 146.

An interlayer insulating film 170 is disposed on the first conductive layer. The interlayer insulating film 170 may perform a function of an insulating film between layers. The interlayer insulating film 170 may include an organic insulating material and perform a surface planarization function.

A second conductive layer is disposed on the interlayer insulating film 170. The second conductive layer includes the first drain electrode 123 and a first source electrode 124 of the first transistor 120, the second drain electrode 143 and a second source electrode 144 of the second transistor 140, and a power electrode 162 disposed on the power line 161.

The first drain electrode 123 and the first source electrode 124 may respectively contact the first doped region 126a and the second doped region 126b of the first active material layer 126 through contact holes passing through the interlayer insulating film 170 and the first gate insulating film 150. The second drain electrode 143 and the second source electrode 144 may respectively contact the third doped region 146a and the fourth doped region 146b of the second active material layer 146 through contact holes passing through the interlayer insulating film 170 and the first gate insulating film 150. The first drain electrode 123 and the second drain electrode 143 may be electrically connected to the first light-blocking layer BML1 and the second light-blocking layer BML2, respectively, through other contact holes.

A via layer 200 is disposed on the second conductive layer. The via layer 200 may include an organic insulating material and perform a surface planarization function.

The banks 410, 420, and 430, the electrodes 210 and 220, and the light-emitting element 300 may be disposed on the via layer 200.

The banks 410, 420, and 430 may include inner banks 410 and 420 disposed to be spaced apart from each other in each sub-pixel PXn, and an outer bank 430 disposed on a boundary of an adjacent sub-pixel PXn.

The outer bank 430 may extend in the second direction DR2 and may be disposed at the boundary between the sub-pixels PXn that are arranged in the first direction DR1. However, the disclosure is not limited thereto, and the outer bank 430 may extend in the first direction DR1 and may be disposed at the boundary between the sub-pixels PXn arranged in the second direction DR2. For example, the outer bank 430 may divide the boundary of each sub-pixel PXn.

During the manufacture of the display device 10, in case that ink in which the light-emitting elements 300 are dispersed is sprayed using an inkjet printing device, the outer bank 430 may perform a function of preventing the ink from crossing the boundary of the sub-pixel PXn. The outer bank 430 may separate inks, in which different light-emitting elements 300 are dispersed, from each other in different sub-pixels PXn so as to prevent the inks from being mixed with each other. However, the disclosure is not limited thereto.

The inner banks 410 and 420 may include a first inner bank 410 and a second inner bank 420 that are disposed adjacent to the central portion of each sub-pixel PXn.

The first inner bank 410 and the second inner bank 420 are disposed to be spaced apart from and face each other. The first electrode 210 may be disposed on the first inner bank 410, and the second electrode 220 may be disposed on the second inner bank 420. Referring to FIGS. 2 and 3, it can be understood that the first electrode branch portion 210B is disposed on the first inner bank 410, and the second electrode branch portion 220B is disposed on the second inner bank 420.

The first inner bank 410 and the second inner bank 420 may extend in the second direction DR2 in each sub-pixel PXn. Although not shown in the drawing, since the first inner bank 410 and the second inner bank 420 extend in the second direction DR2, the first inner bank 410 and the second inner bank 420 may extend toward a sub-pixel PXn that is adjacent in the second direction DR2. However, the disclosure is not limited thereto, and the first inner bank 410 and the second inner bank 420 may be disposed in each sub-pixel PXn to form a pattern on the entire surface of the display device 10. The banks 410, 420, and 430 may include polyimide (PI), but the disclosure is not limited thereto.

The first inner bank 410 and the second inner bank 420 may have a structure in which at least some portions thereof partially protrude from the via layer 200. The first inner bank 410 and the second inner bank 420 may protrude upward from a plane on which the light-emitting element 300 is disposed, and at least some portions of the protruding portions may have an inclination. The protruding shapes of the first inner bank 410 and the second inner bank 420 are not particularly limited. Since the inner banks 410 and 420 protrude from the via layer 200 and have inclined side surfaces, light emitted from the light-emitting element 300 may be reflected at the inclined side surfaces of the inner banks 410 and 420. As will be described below, in case that the electrodes 210 and 220 disposed on the inner banks 410 and 420 include a material having high reflectance, the light emitted from the light-emitting element 300 may be reflected at the electrodes 210 and 220, which are located on the inclined side surfaces of the inner banks 410 and 420, to travel in an upward direction with respect to the via layer 200.

As described above, the banks 410, 420, and 430 may include the same material and may be formed by the same process. However, the outer bank 430 is disposed at the boundary of each sub-pixel PXn to form a grid-shaped pattern, but the inner banks 410 and 420 have a shape that is disposed in each sub-pixel PXn and extends in a direction. The outer bank 430 may divide adjacent sub-pixels PXn and, simultaneously, perform a function of preventing ink from overflowing to the adjacent sub-pixel PXn in an inkjet process, but the inner banks 410 and 420 may have a protruding structure in each sub-pixel PXn to perform a function of a reflective partition wall which reflects the light emitted from the light-emitting element 300 in the upward direction with respect to the via layer 200. However, the disclosure is not limited thereto.

The electrodes 210 and 220 may be disposed on the via layer 200 and the inner banks 410 and 420. As described above, the electrodes 210 and 220 include electrode stem portions 210S and 220S and electrode branch portions 210B and 220B. In FIG. 2, line Xa-Xa' is a line intersecting the first electrode stem portion 210S, line Xb-Xb' is a line intersecting the first electrode branch portion 210B and the second electrode branch portion 220B, and line Xc-Xc' is a line intersecting the second electrode stem portion 220S. For example, it can be understood that, in FIG. 3, the first electrode 210 disposed in region Xa-Xa' is the first electrode stem portion 210S, the first electrode 210 and the second electrode 220 disposed in region Xb-Xb' are the first electrode branch portion 210B and the second electrode branch portion 220B, respectively, and the second electrode 220 disposed in region Xc-Xc' is the second electrode stem portion 220S. Each of the electrode stem portions 210S and 220S and each of the electrode branch portions 210B and 220B may form the first electrode 210 and the second electrode 220, respectively.

Some regions of the first electrode 210 and the second electrode 220 may be disposed on the via layer 200, and some regions thereof may be disposed on the first inner bank 410 and the second inner bank 420. As described above, the first electrode stem portion 210S of the first electrode 210 and the second electrode stem portion 220S of the second electrode 220 extend in the first direction DR1, and the first inner bank 410 and the second inner bank 420 may extend in the second direction DR2 and may also be disposed in the adjacent sub-pixel PXn in the second direction DR2. Although not shown in the drawing, the first electrode stem portion 210S and the second electrode stem portion 220S of the first electrode 210 and the second electrode 220, which extend in the first direction DR1, may partially overlap the first inner bank 410 and the second inner bank 420, respectively. However, the disclosure is not limited thereto, and the first electrode stem portion 210S and the second electrode stem portion 220S may not overlap the first inner bank 410 and the second inner bank 420.

A first electrode contact hole CNTD may be formed in the first electrode stem portion 210S of the first electrode 210 to partially expose the first drain electrode 123 of the first transistor 120 by passing through the via layer 200. The first electrode 210 may contact the first drain electrode 123 through the first electrode contact hole CNTD. The first electrode 210 may be electrically connected to the first drain electrode 123 of the first transistor 120 to receive an electrical signal therefrom.

The second electrode stem portion 220S of the second electrode 220 may extend in a direction and may also be disposed in the non-light-emitting region in which the light-emitting elements 300 are not disposed. A second electrode contact hole CNTS may be formed in the second electrode stem portion 220S to partially expose the power electrode 162 by passing through the via layer 200. The second electrode 220 may contact the power electrode 162 through the second electrode contact hole CNTS. The second electrode 220 may be electrically connected to the power electrode 162 to receive an electrical signal therefrom.

Some regions of the first electrode 210 and the second electrode 220, e.g., the first electrode branch portion 210B and the second electrode branch portion 220B may be respectively disposed on the first inner bank 410 and the second inner bank 420. The first electrode branch portion 210B of the first electrode 210 may be disposed to cover (or overlap) the first inner bank 410, and the second electrode branch portion 220B of the second electrode 220 may be disposed to cover the second inner bank 420. Since the first inner bank 410 and the second inner bank 420 are disposed to be spaced apart from each other at the central portion of each sub-pixel PXn, the first electrode branch portion 210B and the second electrode branch portion 220B may be disposed to be spaced apart from each other. The light-emitting elements 300 may be disposed in a region between the first electrode 210 and the second electrode 220, for example, a space in which the first electrode branch portion 210B and the second electrode branch portion 220B are spaced apart from and face each other.

Each of the electrodes 210 and 220 may include a transparent conductive material. As an example, each of the electrodes 210 and 220 may include materials such as indium tin oxide (ITO), indium zinc oxide (IZO), indium tin-zinc oxide (ITZO), and the like, but the disclosure is not limited thereto. In some embodiments, each of the electrodes 210 and 220 may include a conductive material having high reflectance. For example, each of the electrodes 210 and 220 may include a metal such as silver (Ag), copper (Cu), aluminum (Al), or the like as a material having high reflectance. In this case, light incident on each of the electrodes 210 and 220 may be reflected and emitted in an upward direction with respect to each sub-pixel PXn.

Further, each of the electrodes 210 and 220 may be formed in a structure, in which one or more layers of a transparent conductive material and a metal layer having high reflectance are stacked, or formed as a single layer including the transparent conductive material and the metal layer. In an embodiment, each of the electrodes 210 and 220 may have a stacked structure of ITO/Ag/ITO/IZO or may be formed of an alloy including aluminum (Al), nickel (Ni), lanthanum (La), and the like. However, the disclosure is not limited thereto.

The first insulating layer 510 is disposed on the via layer 200, the first electrode 210, and the second electrode 220. The first insulating layer 510 is disposed to partially cover (or overlap) the first electrode 210 and the second electrode 220. The first insulating layer 510 may be disposed to cover most of an upper surface of each of the first electrode 210 and the second electrode 220 and may partially expose the first electrode 210 and the second electrode 220. The first insulating layer 510 may be disposed to partially expose upper surface of the first electrode 210 and the upper surface of the second electrode 220, e.g., an upper surface of the first electrode branch portion 210B disposed on the first inner bank 410 and an upper surface of the second electrode branch portion 220B disposed on the second inner bank 420. For example, the first insulating layer 510 may be formed substantially entirely on the via layer 200 and may include openings that partially expose the first electrode 210 and the second electrode 220. The openings of the first insulating layer 510 may be located to expose relatively flat upper surfaces of the first electrode 210 and the second electrode 220.

In an embodiment, a step may be formed in the first insulating layer 510 between the first electrode 210 and the second electrode 220 so that a portion of an upper surface of the first insulating layer 510 is recessed. In some embodiments, the first insulating layer 510 may include an inorganic insulating material, and the portion of the upper surface of the first insulating layer 510, which is disposed to cover the first electrode 210 and the second electrode 220, may be recessed due to a step of a member disposed below the first insulating layer 510. The light-emitting element 300 disposed on the first insulating layer 510 between the first electrode 210 and the second electrode 220 may form an empty space between itself and the recessed upper surface of the first insulating layer 510. The light-emitting element 300 may be disposed in a state of being partially spaced apart from the upper surface of the first insulating layer 510, and the empty space may be filled with a material forming the second insulating layer 520, which will be described below.

However, the disclosure is not limited thereto. The upper surface of the first insulating layer 510 may be formed to be flat so that the light-emitting element 300 is disposed thereon. The upper surface may extend in a direction toward the first electrode 210 and the second electrode 220 to be terminated at the inclined side surfaces of the first electrode 210 and the second electrode 220. For example, the first insulating layer 510 may be disposed in a region in which the electrodes 210 and 220 overlap the inclined side surfaces of the first inner bank 410 and the second inner bank 420. Contact electrodes 261 and 262, which will be described below, may contact the exposed regions of the first electrode 210 and the second electrode 220 and may smoothly contact an end portion of the light-emitting element 300 on the flat upper surface of the first insulating layer 510.

The first insulating layer 510 may protect the first electrode 210 and the second electrode 220 and, simultaneously, insulate the first electrode 210 and the second electrode 220 from each other. The light-emitting element 300 disposed on the first insulating layer 510 may be prevented from being damaged by directly contacting other members. However, the shape and structure of the first insulating layer 510 are not limited thereto.

The light-emitting element 300 may be disposed on the first insulating layer 510 between the electrodes 210 and 220. As an example, at least one light-emitting element 300 may be disposed on the first insulating layer 510 that is disposed between the electrode branch portions 210B and 220B. However, the disclosure is not limited thereto, and, although not shown in the drawing, at least some portions of the light-emitting elements 300, which are disposed in each sub-pixel PXn, may be disposed in a region other than the region between the electrode branch portions 210B and 220B. The light-emitting element 300 may be disposed at a position at which a partial region thereof overlaps the electrodes 210 and 220. The light-emitting element 300 may be disposed on an end portion of each of the first electrode branch portion 210B and the second electrode branch portion 220B facing each other and electrically connected to the electrodes 210 and 220 through the contact electrodes 261 and 262.

As described above, the light-emitting elements 300, which emit the light, and having different wavelengths, may be disposed in each sub-pixel PXn. Although only the first sub-pixel PX1 in which the first light-emitting elements 301 are disposed is shown in the drawing, it is apparent that the same may be applied to the case of the second sub-pixel PX2 and the third sub-pixel PX3.

Further, in the light-emitting element 300, layers may be disposed in a direction horizontal to the via layer 200. The light-emitting element 300 of the display device 10 according to an embodiment may have a shape extending in a direction and have a structure in which semiconductor layers are sequentially disposed in one direction. As will be described below, in the light-emitting element 300, a first semiconductor layer 310, an active layer 330, a second semiconductor layer 320, and an electrode layer 370 may be sequentially disposed in a direction, and an insulating film 380 may surround outer surfaces of the first semiconductor layer 310, the active layer 330, the second semiconductor layer 320, and the electrode layer 370. The light-emitting element 300 disposed in the display device 10 may be disposed such that an extending one direction thereof is parallel to the via layer 200, and the semiconductor layers included in the light-emitting element 300 may be sequentially disposed in a direction parallel to an upper surface of the via layer 200. However, the disclosure is not limited thereto. In some cases, in case that the light-emitting element 300 has a different structure, the layers may be disposed in a direction perpendicular to the via layer 200.

Further, one end portion (or first end portion) of the light-emitting element 300 may contact a first contact electrode 261, and the other end portion (or second end portion) thereof may contact a second contact electrode 262. According to an embodiment, since the insulating film 380 is not formed on the end surfaces of the light-emitting element 300 in one direction, in which the light-emitting element 300 extends, and the end surfaces thereof are exposed, the exposed end surfaces may contact the first contact electrode 261 and the second contact electrode 262, which will be described below. However, the disclosure is not limited thereto. In some cases, at least a partial region of the insulating film 380 is removed from the light-emitting element 300, and as the insulating film 380 is removed, side surfaces of both end portions of the light-emitting element 300 may be partially exposed. In forming the second insulating layer 520 covering the outer surface of the light-emitting element 300 during the process of manufacturing the display device 10, the insulating film 380 may be partially removed. The exposed side surfaces of the light-emitting element 300 may contact the first contact electrode 261 and the second contact electrode 262. However, the disclosure is not limited thereto.

The second insulating layer 520 may be partially disposed on the light-emitting element 300. The second insulating layer 520 may be disposed to partially surround the outer surface of the light-emitting element 300. The second insulating layer 520 may serve to protect the light-emitting element 300 and, simultaneously, fix the light-emitting element 300 in the process of manufacturing the display device 10. Further, in an embodiment, a portion of a material of the second insulating layer 520 may be disposed between the first insulating layer 510 and a lower surface of the light-emitting element 300. As described above, the second insulating layer 520 may be formed to fill the space between the first insulating layer 510 and the light-emitting element 300, which is formed during the process of manufacturing the display device 10. Accordingly, the second insulating layer 520 may be formed to surround the outer surface of the light-emitting element 300. However, the disclosure is not limited thereto.

The second insulating layer 520 may extend between the first electrode branch portion 210B and the second electrode branch portion 220B in the second direction DR2 in a plan view. As an example, in a plan view, the second insulating layer 520 may have an island shape or a linear shape on the via layer 200.

The contact electrodes 261 and 262 are disposed on each of the electrodes 210 and 220 and the second insulating layer 520. The first contact electrode 261 and the second contact electrode 262 may be disposed to be spaced apart from each other on the second insulating layer 520. The second insulating layer 520 may insulate the first contact electrode 261 and the second contact electrode 262 from each other so as not to directly contact each other.

Although not shown in the drawing, the contact electrodes 261 and 262 may extend in the second direction DR2 in a plan view, and may be disposed to be spaced apart from each other in the first direction DR1. The contact electrodes 261 and 262 may contact at least one end portion of the light-emitting element 300, and the contact electrodes 261 and 262 may be electrically connected to the first electrode 210 or the second electrode 220 to receive an electrical signal. The contact electrodes 261 and 262 may include the first contact electrode 261 and the second contact electrode 262. The first contact electrode 261 may be disposed on the first electrode branch portion 210B and may contact one end portion of the light-emitting element 300, and the second contact electrode 262 may be disposed on the second electrode branch portion 220B and may contact the other end portion of the light-emitting element 300.

The first contact electrode 261 may contact the exposed partial region of the first electrode 210 on the first inner bank 410, and the second contact electrode 262 may contact the exposed partial region of the second electrode 220 on the second inner bank 420. The contact electrodes 261 and 262 may transmit electrical signals, which are transmitted from the electrodes 210 and 220, to the light-emitting element 300.

The contact electrodes 261 and 262 may include a conductive material. For example, the contact electrodes 261 and 262 may include ITO, IZO, ITZO, aluminum (Al), or the like. However, the disclosure is not limited thereto.

The passivation layer 550 may be disposed on the first contact electrode 261, the second contact electrode 262, and the second insulating layer 520. The passivation layer 550 may serve to protect members disposed on the via layer 200 from an external environment.

Each of the first insulating layer 510, the second insulating layer 520, and the passivation layer 550, which are described above, may include an inorganic insulating material or an organic insulating material. In an embodiment, each of the first insulating layer 510, the second insulating layer 520, and the passivation layer 550 may include an inorganic insulating material such as silicon oxide ($SiO_x$), silicon nitride ($SiN_x$), silicon oxynitride ($SiO_xN_y$), aluminum oxide ($Al_2O_3$), aluminum nitride (AlN), or the like. Further, each of the first insulating layer 510, the second insulating layer 520, and the passivation layer 550 may include acrylic resin, epoxy resin, phenolic resin, polyamide resin, polyimide resin, unsaturated polyester resin, polyphenylene resin, polyphenylene sulfide resin, benzocyclobutene, cardo resin, siloxane resin, silsesquioxane resin, polymethylmethacrylate, polycarbonate, polymethylmethacrylate-polycarbonate synthetic resin, or the like as an organic insulating material. However, the disclosure is not limited thereto.

The display device 10 may include a greater number of insulating layers. According to an embodiment, the display device 10 may further include a third insulating layer 530 disposed to protect the first contact electrode 261.

Figure 4:
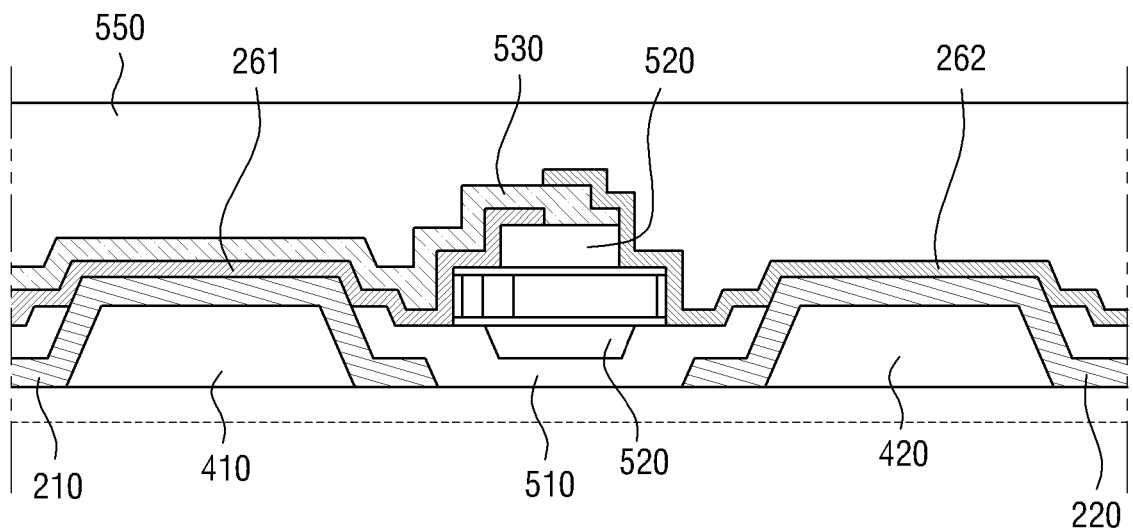
FIG. 4 is a schematic cross-sectional view illustrating a portion of a display device according to another embodiment.

FIG. 4 is a schematic cross-sectional view illustrating a portion of a display device according to another embodiment.

Referring to FIG. 4, a display device 10 according to an embodiment may further include a third insulating layer 530 disposed on a first contact electrode 261. The display device 10 is different from the display device 10 of FIG. 3 at least in that the third insulating layer 530 is further included so that at least a portion of a second contact electrode 262 is disposed on the third insulating layer 530. Hereinafter, repetitive descriptions will be omitted, and a description will be made to focus on differences.

The display device 10 of FIG. 4 may include the third insulating layer 530 that is disposed on the first contact electrode 261 and configured to electrically insulate the first contact electrode 261 and the second contact electrode 262 from each other. The third insulating layer 530 may be disposed to cover (or overlap) the first contact electrode 261 and may be disposed not to overlap a partial region of a light-emitting element 300 so that the light-emitting element 300 may be electrically connected to the second contact electrode 262. A portion of the third insulating layer 530 may contact the first contact electrode 261 and a second insulating layer 520 at an upper surface of the second insulating layer 520. The third insulating layer 530 may be disposed to cover one end portion of the first contact electrode 261 on the second insulating layer 520. Accordingly, the third insulating layer 530 may protect the first contact electrode 261 and electrically insulate the first contact electrode 261 from the second contact electrode 262.

A side surface of the third insulating layer 530 in a direction in which the second contact electrode 262 is disposed may be aligned with a side surface of the second insulating layer 520. However, the disclosure is not limited thereto. In some embodiments, similar to the first insulating layer 510, the third insulating layer 530 may include an inorganic insulating material.

The first contact electrode 261 may be disposed between the first electrode 210 and the third insulating layer 530, and the second contact electrode 262 may be disposed on the third insulating layer 530. The second contact electrode 262 may partially contact the first insulating layer 510, the second insulating layer 520, the third insulating layer 530, the second electrode 220, and the light-emitting element 300. An end portion of the second contact electrode 262 in a direction in which the first electrode 210 is disposed may be disposed on the third insulating layer 530.

A passivation layer 550 may be disposed on the third insulating layer 530 and the second contact electrode 262 and protect the third insulating layer 530 and the second contact electrode 262. Hereinafter, repetitive descriptions will be omitted.

The light-emitting element 300 may be a light-emitting diode, and specifically, may be an inorganic light-emitting diode having a size of a micrometer unit or a nanometer unit and made of an inorganic material. The inorganic light-emitting diode may be aligned between two electrodes in which polarity is formed by forming an electric field in a specific direction between the two electrodes facing each other. The light-emitting elements 300 may be aligned between two electrodes due to an electric field formed on the two electrodes.

The light-emitting element 300 may have a shape extending in a direction. The light-emitting element 300 may have a shape of a rod, a wire, a tube, or the like. In an embodiment, the light-emitting element 300 may have a cylindrical shape or a rod shape. However, the shape of the light-emitting element 300 is not limited thereto, and the light-emitting element 300 may have a shape of a cube, a rectangular parallelepiped, a polygonal pillar such as a hexagonal pillar or the like or have a shape that extends in a direction and have a partially inclined outer surface. Thus, the light-emitting element 300 may have various shapes. Semiconductors included in the light-emitting element 300, which will be described below, may have a structure in which the semiconductors are sequentially disposed or stacked in the one direction.

The light-emitting element 300 may include a semiconductor layer doped with an arbitrary conductive-type (for example, p-type or n-type) impurity. The semiconductor layer may receive an electrical signal applied from an external power source and emit the received electrical signal as light in a specific wavelength band.

Figure 5:
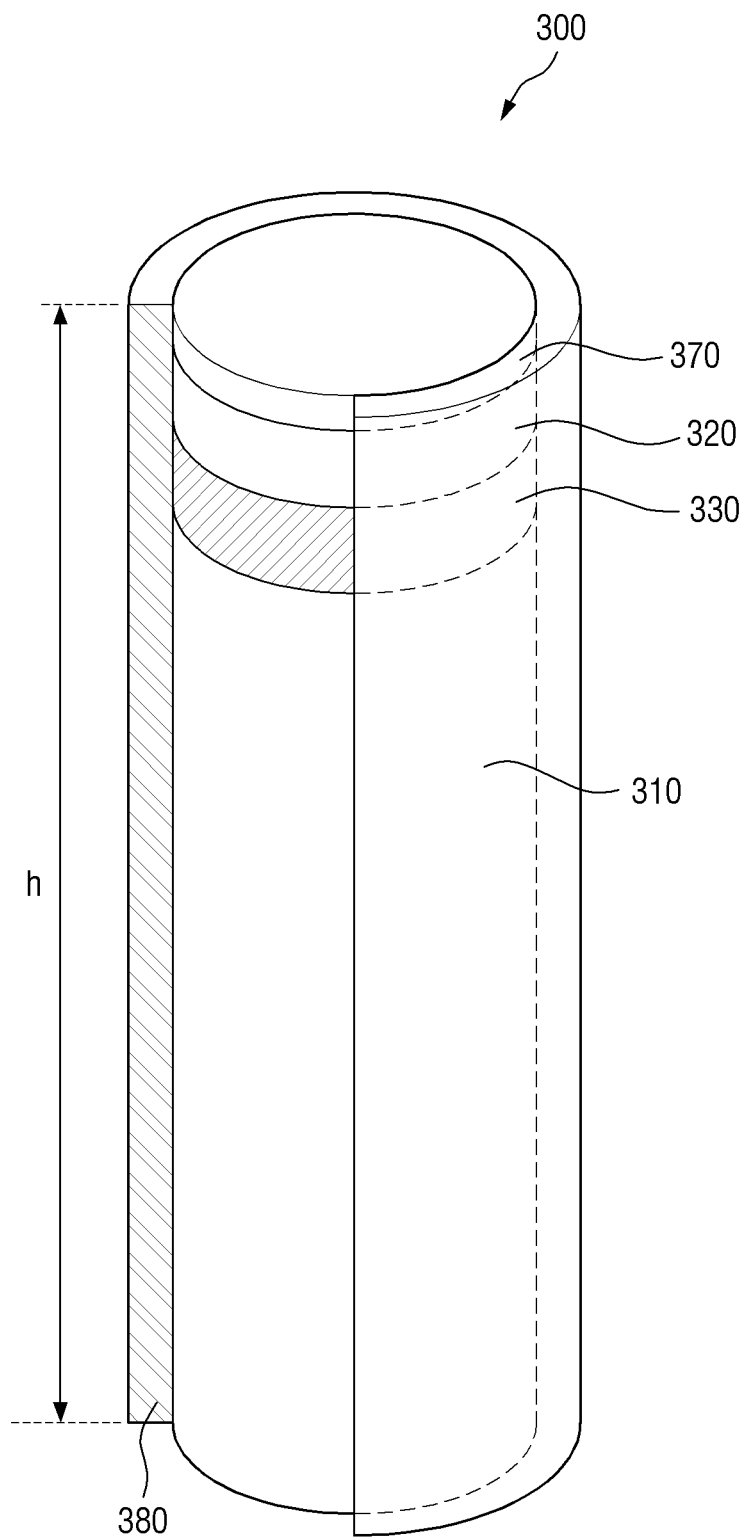
FIG. 5 is a schematic view of a light-emitting element according to an embodiment.

FIG. 5 is a schematic view of a light-emitting element according to an embodiment.

A light-emitting element 300 according to an embodiment may emit light in a specific wavelength band. In an embodiment, an active layer 330 may emit blue light having a central wavelength band ranging from about 450 nm to about 495 nm. However, the central wavelength band of the blue light is not limited to the above-described range, and it should be understood that the central wavelength band includes all wavelength bands that may be recognized as a blue color in the art. The light emitted from the active layer 330 of the light-emitting element 300 is not limited thereto, and the light may be green light having a central wavelength band ranging from about 495 nm to about 570 nm or red light having a central wavelength band ranging from about 620 nm to about 750 nm. Hereinafter, an example in which the light-emitting element 300 emits blue light will be described.

Referring to FIG. 5, the light-emitting element 300 may include a first semiconductor layer 310, a second semiconductor layer 320, the active layer 330, an electrode layer 370, and an insulating film 380.

For example, the first semiconductor layer 310 may be an n-type semiconductor having a first conductive type. As an example, in case that the light-emitting element 300 emits light in a blue wavelength band, the first semiconductor layer 310 may include a semiconductor material having a chemical formula of $Al_xGa_yIn_{1-x-y}N$ ($0 \leq x \leq 1$, $0 \leq y \leq 1$, and $0 \leq x+y \leq 1$). For example, the semiconductor material may be one or more among AlGaInN, GaN, AlGaN, InGaN, AlN, and InN that are doped with an n-type impurity. The first semiconductor layer 310 may be doped with a first conductive type dopant. As an example, the first conductive type dopant may be Si, Ge, Sn, or the like. In an embodiment, the first semiconductor layer 310 may be n-GaN doped with n-type Si. A length of the first semiconductor layer 310 may range from about 1.5 μm to about 5 μm, but the disclosure is not limited thereto.

The second semiconductor layer 320 is disposed on the active layer 330 that will be described below. For example, the second semiconductor layer 320 may be a p-type semiconductor having a second conductive type. As an example, in case that the light-emitting element 300 emits light in a blue or green wavelength band, the second semiconductor layer 320 may include a semiconductor material having a chemical formula of $Al_xGa_yIn_{1-x-y}N$ ($0 \leq x \leq 1$, $0 \leq y \leq 1$, and $0 \leq x+y \leq 1$). For example, the semiconductor material may be one or more among AlGaInN, GaN, AlGaN, InGaN, AlN, and InN that are doped with a p-type impurity. The second semiconductor layer 320 may be doped with a second conductive type dopant. As an example, the second conductive type dopant may be Mg, Zn, Ca, Se, Ba, or the like. In an embodiment, the second semiconductor layer 320 may be p-GaN doped with p-type Mg. A length of the second semiconductor layer 320 may range from about 0.05 μm to about 0.10 μm, but the disclosure is not limited thereto.

FIG. 5 illustrates that the first semiconductor layer 310 and the second semiconductor layer 320 are formed of single layers, but the disclosure is not limited thereto. According to some embodiments, the first semiconductor layer 310 and the second semiconductor layer 320 may further include a greater number of layers, e.g., a clad layer or a tensile strain barrier reducing (TSBR) layer according to a material of the active layer 330. A description thereof will be made below with reference to other drawings.

The active layer 330 is disposed between the first semiconductor layer 310 and the second semiconductor layer 320. The active layer 330 may include a material having a single or multiple quantum well structure. In case that the active layer 330 includes a material having a multiple quantum well structure, the active layer 330 may have a structure in which quantum layers and well layers are alternately stacked. The active layer 330 may emit light by combination of electron-hole pairs in response to electrical signals applied through the first semiconductor layer 310 and the second semiconductor layer 320. As an example, in case that the active layer 330 emits light in a blue wavelength band, the active layer 330 may include a material such as AlGaN, AlGaInN, or the like. In case that the active layer 330 has a multiple quantum well structure in which quantum layers and well layers are alternately stacked, the quantum layer may include a material such as AlGaN or AlGaInN, and the well layer may include a material such as GaN or AlInN. In an embodiment, the active layer 330 includes AlGaInN as a quantum layer and AlInN as a well layer. As described above, the active layer 330 may emit blue light having a central wavelength band ranging from about 450 nm to about 495 nm.

However, the disclosure is not limited thereto, and the active layer 330 may have a structure in which semiconductor materials having large bandgap energy and semiconductor materials having small bandgap energy are alternately stacked or include other group III to V semiconductor materials according to the wavelength band of emitted light. The light emitted from the active layer 330 is not limited to the light in a blue wavelength band, and the active layer 330 may also emit light in a red or green wavelength band in some cases. A length of the active layer 330 may range from about 0.05 μm to about 0.10 μm, but the disclosure is not limited thereto.

The light emitted from the active layer 330 may be emitted to not only an outer surface of the light-emitting element 300 in a lengthwise direction but also both side surfaces of the light-emitting element 300. Directivity of the light emitted from the active layer 330 is not limited to a direction.

The electrode layer 370 may be an ohmic contact electrode. However, the disclosure is not limited thereto, and the electrode layer 370 may also be a Schottky contact electrode. The light-emitting element 300 may include at least one electrode layer 370. Although FIG. 5 illustrates that the light-emitting element 300 includes an electrode layer 370, the disclosure is not limited thereto. In some cases, the light-emitting element 300 may include a greater number of electrode layers 370, or the electrode layer 370 may be omitted. A description of the light-emitting element 300, which will be made below, may be applied even in case that the number of electrode layers 370 is varied or another structure is further included.

In the display device 10 according to an embodiment, in case that the light-emitting element 300 is electrically connected to the electrode or the contact electrode, the electrode layer 370 may decrease the resistance between the light-emitting element 300 and the electrode or between the light-emitting element 300 and the contact electrode. The electrode layer 370 may include a conductive metal. For example, the electrode layer 370 may include at least one of aluminum (Al), titanium (Ti), indium (In), gold (Au), silver (Ag), indium tin oxide (ITO), indium zinc oxide (IZO), and indium tin-zinc oxide (ITZO). Further, the electrode layer 370 may include a semiconductor material doped with an n-type or p-type impurity. The electrode layer 370 may include a same material or different materials, but the disclosure is not limited thereto.

The insulating film 380 is disposed to surround outer surfaces of the semiconductor layers and the electrode layers, which are described above. In an embodiment, the insulating film 380 may be disposed to surround at least the outer surface of the active layer 330 and may extend in a direction in which the light-emitting element 300 extends. The insulating film 380 may serve to protect the members. As an example, the insulating film 380 may be formed to surround side surfaces of the members and may be formed to expose both end portions of the light-emitting element 300 in a lengthwise direction.

In the drawing, the insulating film 380 is illustrated as being formed to extend in the lengthwise direction of the light-emitting element 300 to cover from the first semiconductor layer 310 to a side surface of the electrode layer 370, but the disclosure is not limited thereto. Since the insulating film 380 covers only the outer surfaces of some semiconductor layers including the active layer 330 or covers only a portion of the outer surface of the electrode layer 370, the outer surface of the electrode layer 370 may be partially exposed. An upper surface of the insulating film 380 may be formed to be rounded in a cross section in a region adjacent to at least one end portion of the light-emitting element 300.

The insulating film 380 may have a thickness ranging from about 10 nm to about 1.0 µm, but the disclosure is not limited thereto. The thickness of the insulating film 380 may be about 40 nm.

The insulating film 380 may include materials having insulating properties such as silicon oxide ($SiO_x$), silicon nitride ($SiN_x$), silicon oxynitride ($SiO_xN_y$), aluminum nitride (AlN), aluminum oxide ($Al_2O_3$), or the like. Accordingly, it is possible to prevent an electrical short circuit that may occur in case that the active layer 330 directly contacts the electrode through which an electrical signal is transmitted to the light-emitting element 300. Further, since the insulating film 380 protects the outer surface of the light-emitting element 300 including the active layer 330, it is possible to prevent degradation in light emission efficiency.

Further, in some embodiments, an outer surface of the insulating film 380 may be surface treated. In the manufacture of the display device 10, the light-emitting elements 300 may be aligned by being sprayed onto the electrodes in a state of being dispersed in ink. Here, in order to allow the light-emitting elements 300 to remain dispersed in the ink without being aggregated with other adjacent light-emitting elements 300, the surface of the insulating film 380 may be hydrophobically or hydrophilically treated.

The light-emitting element 300 may have a length h ranging from about 1 µm to about 10 µm or from about 2 µm to about 6 µm, or from about 3 µm to about 5 µm. A diameter of the light-emitting element 300 may range from about 300 nm to about 700 nm, and an aspect ratio of the light-emitting element 300 may range from about 1.2 to about 100. However, the disclosure is not limited thereto, and the light-emitting elements 300 included in the display device 10 may have different diameters according to a composition difference of the active layer 330. In an embodiment, each of the light-emitting elements 300 may have a diameter of about 500 nm.

As described above, the display device 10 may include the first electrode 210 and the second electrode 220 having different widths so that the light-emitting elements 300 disposed between the first electrode 210 and the second electrode 220 have a uniform distribution. Hereinafter, a structure of the first electrode 210 and the second electrode 220 of the display device 10 according to an embodiment will be described in detail with further reference to other drawings.

Figure 6:
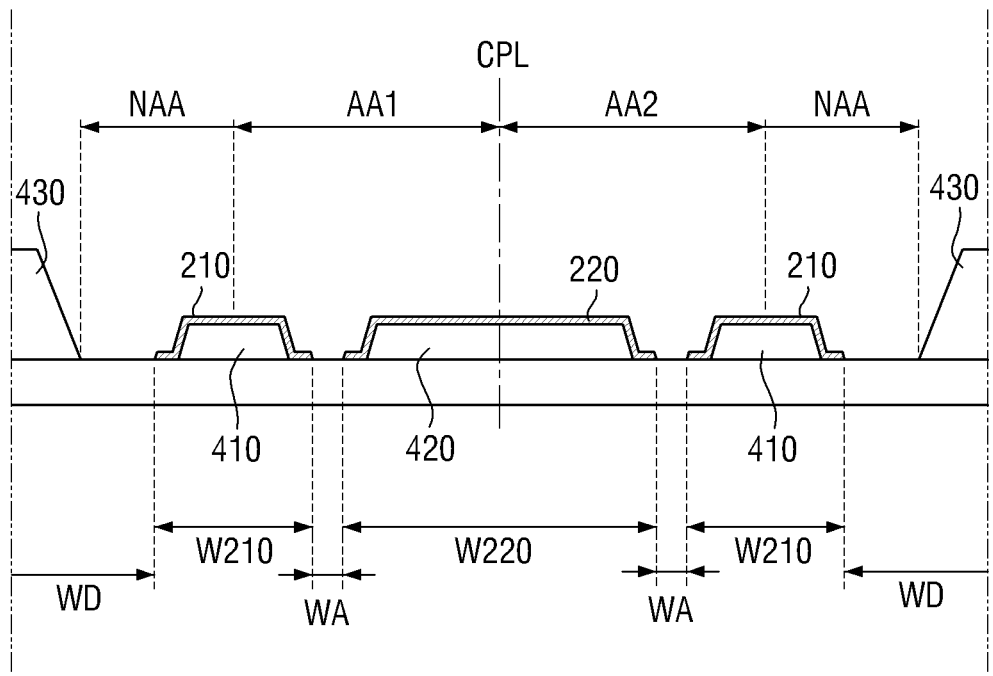
FIG. 6 is a schematic cross-sectional view taken across a sub-pixel of the display device according to an embodiment.
Figure 8:
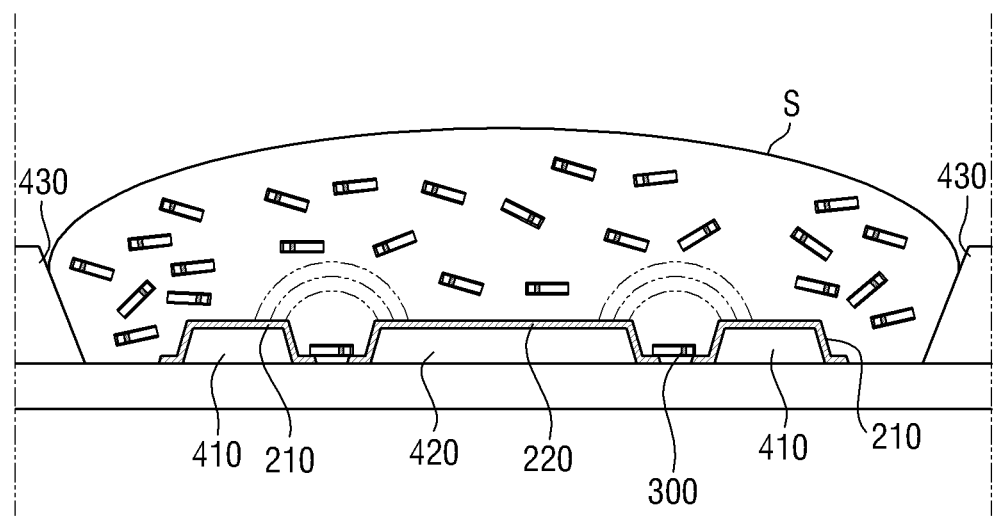

FIG. 6 is a schematic cross-sectional view taken across the sub-pixel of the display device according to an embodiment. FIGS. 7 and 8 are schematic views illustrating a state in which ink, in which the light-emitting elements are dispersed, is sprayed onto the sub-pixel of the display device according to an embodiment.

In FIGS. 6 to 8, schematic cross sections each intersecting a sub-pixel PXn are illustrated. For convenience of description, only the outer bank 430, the inner banks 410 and 420, and the first electrode 210, and the second electrode 220, which are disposed in each sub-pixel PXn, are shown in FIGS. 6 to 8. However, even though other members, for example, the insulating layers 510 and 520, the contact electrodes 261 and 262, and the like are not shown in the drawings, descriptions made below may be applied to the embodiments including the insulating layers 510 and 520, the contact electrodes 261 and 262, and the like.

Referring to FIGS. 6 to 8, outer banks 430 and inner banks 410 and 420 are disposed in each sub-pixel PXn. The outer bank 430 may be disposed at the boundary between adjacent sub-pixels PXn. The outer bank 430 located at a side may be a first outer bank, and the outer bank 430 located at another side may be a second outer bank. The first outer bank and the second outer bank may each be disposed at the boundary between the sub-pixels PXn, and a pixel center line CPL of the sub-pixel PXn may be defined in a region where the first outer bank and the second outer bank are spaced apart from each other. The first outer bank and the second outer bank may be disposed to be spaced apart from the pixel center line CPL by the same separation distance.

The inner banks 410 and 420 may be disposed between the outer banks 430, for example, between the first outer bank and the second outer bank. As described above, the first electrode 210 and the second electrode 220 are disposed on the inner banks 410 and 420, respectively. Accordingly, the first electrode 210 and the second electrode 220 may be disposed between the outer banks 430. A region in which the light-emitting elements 300 are disposed and a region in which the light-emitting elements 300 are not disposed may be defined in each sub-pixel PXn. In some embodiments, alignment regions AA1 and AA2 between the first electrode 210 and the second electrode 220 and a non-alignment region NAA between the first electrode 210 or the second electrode 220 and the outer bank 430 may be defined in each sub-pixel PXn. The alignment regions AA1 and AA2 and the non-alignment region NAA may be defined as regions including a portion of each of the electrodes 210 and 220, including spaces between each of the electrodes 210 and 220 and the outer bank 430. As shown in the drawings, the alignment regions AA1 and AA2 and the non-alignment region NAA may be defined based on a central portion of each of the first electrode 210 and the second electrode 220. The light-emitting elements 300 may be disposed in the alignment regions AA1 and AA2 and electrically connected to the first electrode 210 and the second electrode 220. In the non-alignment region NAA, the light-emitting elements 300 may not be disposed, or may not be electrically connected to the first electrode 210 or the second electrode 220 even though the light-emitting elements 300 are disposed.

In an embodiment, a central portion of the second inner bank 420 may be located on the same line with (or colinear with) the pixel center line CPL, and the central portion of the second electrode 220 may also be located collinear with the pixel center line CPL. First electrodes 210 may be disposed to be spaced apart from each of both sides of the second electrode 220. As shown in the drawing, a second electrode 220 and two first electrodes 210 may be disposed in each sub-pixel PXn, and the second electrode 220 may be disposed between the first electrodes 210. The central portion of the second electrode 220 is located collinear with the pixel center line CPL, and the first electrode 210 and the second electrode 220 may be disposed to be symmetrical with respect to the pixel center line CPL. Accordingly, a first alignment region AA1 and a second alignment region AA2, in which the light-emitting elements 300 are disposed, may be respectively located between the central portion of the second electrode 220 and the central portion of each of the first electrodes 210, and the non-alignment region NAA may be located between the central portion of the first electrode 210 and each of the outer banks 430.

However, the disclosure is not limited thereto, and in some cases, the pixel center line CPL may be spaced apart from the first electrode 210 and the second electrode 220 without overlapping. This will be described below with reference to other embodiments.

During the process of manufacturing the display device 10, the light-emitting elements 300 may be sprayed onto the electrodes 210 and 220 of each sub-pixel PXn in a state of being dispersed in ink S. As shown in FIG. 7, the ink S sprayed into each sub-pixel PXn is located in a region partitioned by the outer banks 430. As the electrodes 210 and 220 and the outer banks 430 are disposed to be spaced from each other, regions formed by the electrodes 210 and 220 and the outer bank 430 being spaced apart from each other may be distinguished in each sub-pixel PXn. Since the light-emitting elements 300 may be distributed or dispersed in a uniform distribution in the ink S, the number of the light-emitting elements 300 located in each region may vary depending on an area or volume of each of the regions formed by the electrodes 210 and 220 and the outer banks 430 being separated apart from each other.

In case that the area or volume of the non-alignment region NAA is greater than the area or volume of each of the alignment regions AA1 and AA2, among the light-emitting elements 300 dispersed in the ink S, the number of the light-emitting elements 300 located in the non-alignment region NAA may be greater than that located in each of the alignment regions AA1 and AA2. In this case, among the light-emitting elements 300 sprayed in each sub-pixel PXn, the number of the light-emitting elements 300 that are disposed in the non-alignment region NAA and not electrically connected to the electrodes 210 and 220 may be greater than the number of the light-emitting elements 300 that are disposed in each of the alignment regions AA1 and AA2 and electrically connected to the first electrode 210 and the second electrode 220. Further, in case that a greater number of electrodes 210 and 220 are disposed and a greater number of alignment regions AA1 and AA2 are defined, the number of the light-emitting elements 300 disposed in each of the alignment regions AA1 and AA2 may not be uniform.

The display device 10 according to an embodiment includes the first electrode 210 and the second electrode 220 having different widths, and thus the area or volume of each of the alignment regions AA1 and AA2 defined in each sub-pixel PXn may be greater than the area or volume of the non-alignment region NAA.

According to some embodiments, the display device 10 may include an inner electrode disposed between the outer banks 430 to be adjacent to the pixel center line CPL, and outer electrodes each spaced apart from the inner electrode and having a separation distance from the pixel center line CPL greater than that of the inner electrode. The outer electrode may be disposed closer to the outer bank 430 than the inner electrode. As illustrated in FIG. 7, the second electrode 220 may be the inner electrode, and each of the first electrodes 210 may be the outer electrode. The non-alignment region NAA may be a region between the outer electrode and the outer bank 430, and the alignment regions AA1 and AA2 may be regions between each of the outer electrodes and the inner electrode.

Since the alignment regions AA1 and AA2 and the non-alignment region NAA are defined based on the central portion of each of the electrodes 210 and 220, a width, area, or volume of the non-alignment region NAA may be adjusted by adjusting a width of each of the electrodes 210 and 220. According to an embodiment, a width of the inner electrode may be different from a width of the outer electrode, and in some embodiments, the width of the inner electrode may be greater than the width of the outer electrode. For example, a width W220 of the second electrode 220, which is the inner electrode, may be greater than a width W210 of the first electrode 210, which is the outer electrode. In case that a width of the sub-pixel PXn is constant, as the width of the inner electrode increases, a width between the outer electrode and the outer bank 430 may become smaller.

In some embodiments, a separation distance between the outer bank 430 and the outer electrode may be less than a separation distance between the outer electrode and the pixel center line CPL. As another example, a separation distance between the central portion of the first electrode 210 and the outer bank 430 may be less than a separation distance between the central portion of the first electrode 210 and the central portion of the second electrode 220. Accordingly, a width of each of the first alignment region AA1 and the second alignment region AA2, which are regions between the first electrodes 210 and the second electrode 220, may be greater than the width of the non-alignment region NAA, which is a region between the first electrode 210 and the outer bank 430.

During the process of manufacturing the display device 10, in case that the ink S in which the light-emitting elements 300 are dispersed is sprayed onto the electrodes 210 and 220, the light-emitting elements 300 may be located in a uniform distribution on the electrodes 210 and 220 between the outer banks 430. As the width of the second electrode 220, which is the inner electrode, becomes greater in the sub-pixel PXn having a constant width, the width of the second electrode 220 may become greater than the width between the first electrode 210, which is the outer electrode, and the outer bank 430. Among the light-emitting elements 300 uniformly distributed in the ink S, a greater number of the light-emitting elements 300 may be located in the region between the inner electrode and the outer electrode than in the region between the outer electrode and the outer bank 430. The number of the light-emitting elements 300 disposed between the inner electrode and the outer electrode may be greater than the number of the light-emitting elements 300 disposed between the outer electrode and the outer bank 430.

Thereafter, as shown in FIG. 8, in case that an electrical signal is applied to each of the electrodes, for example, the first electrode 210, which is the outer electrode, and the second electrode 220, which is the inner electrode, an electric field is formed therebetween. The light-emitting elements 300 may receive a dielectrophoretic force by the electric field and may be aligned in the ink S between the first electrode 210 and the second electrode 220. Most of the light-emitting elements 300 dispersed in the ink S may be disposed in the region between the first electrode 210 and the second electrode 220 occupying a greater area. In the display device 10 according to an embodiment, by increasing the number of the light-emitting elements 300 disposed between the electrodes and electrically connected thereto, the manufacturing efficiency of the display device 10 may be increased, and the light-emitting elements 300 may be disposed in a uniform distribution in case that electrodes are disposed.

In case that detailed descriptions are made for the electrodes 210 and 220 of each sub-pixel PXn, a first width W210 of the first electrode 210, a second width W220 of the second electrode 220, a first separation distance WD between the first electrode 210, which is the outer electrode, and the outer bank 430, and a second separation distance WA between the first electrode 210 and the second electrode 220 may be defined. The width of each of the electrodes 210 and 220 and the separation distance between the outer bank 430 and each of the electrodes 210 and 220 may satisfy Equation 1 below. In Equation 1, "WE" may be the first width W210 of the first electrode 210 or the second width W220 of the second electrode 220.

$$WD < WA + WE/2 \quad \text{[Equation 1]}$$

(where "WD" is the first separation distance between the first electrode 210 and the outer bank 430, "WA" is the second separation distance between the first electrode 210 and the second electrode 220, and "WE" is the width of the first electrode or the second electrode).

As shown in FIG. 6, in case that a description is made based on the first outer bank, the first electrode 210, and the second electrode 220 located on a side of the pixel center line CPL, the first alignment region AA1 and the non-alignment region NAA may be located on a side of the pixel center line CPL. The width of the first alignment region AA1 may be greater than that of the non-alignment region NAA such that more light-emitting elements 300 are disposed in the first alignment region AA1. According to an embodiment, based on the first electrode 210, which is the outer electrode, the first separation distance WD between the first electrode 210 and the first outer bank 430 may be less than a sum of the second separation distance WA between the first electrode 210, which is the outer electrode, and the second electrode 220, which is the inner electrode, and a half of the second width W220 of the second electrode 220.

A side of the first electrode 210, which is the outer electrode, facing the first outer bank 430 is the non-alignment region NAA, and another side thereof facing the second electrode 220 is the first alignment region AA1. The width of the second electrode 220, which is the inner electrode, may be adjusted to increase the width of the first alignment region AA1 to be greater than that of the non-alignment region NAA. In case that the first electrode 210 and the second electrode 220 satisfy Equation 1 described above, the region between the first outer bank and the first electrode 210, which is the outer electrode, may be minimized so that the first alignment region AA1 may have a greater area than the non-alignment region NAA. In Equation 1 described above, "WE" may be the width of the inner electrode. Only the case in which the inner electrode is the second electrode 220 is illustrated in FIG. 6, but in some cases, the first electrode 210 may be the inner electrode and the second electrode 220 may be the outer electrode.

The light-emitting element 300 has a shape extending in a direction, and may be disposed such that the one direction is parallel to the upper surface of the via layer 200 between the first electrode 210 and the second electrode 220. According to an embodiment, the separation distance WA between the first electrode 210 and the second electrode 220 may be less than the length h of the light-emitting element 300. The light-emitting elements 300 disposed in the alignment regions AA1 and AA2 may each have an end portion electrically connected to the first electrode 210 and the other end portion electrically connected to the second electrode 220. In some embodiments, the separation distance WA between the first electrode 210 and the second electrode 220 is less than the length h of the light-emitting element 300, and both end portions of the light-emitting element 300 may be located on the first electrode 210 and the second electrode 220, respectively.

The relationship between the first width W210 and the second width W220 of the first electrode 210 and the second electrode 220, or the inner electrode and the outer electrode may vary within a range satisfying Equation 1. As an example, the width of the inner electrode may be less than the width of the outer electrode.

Figure 9:
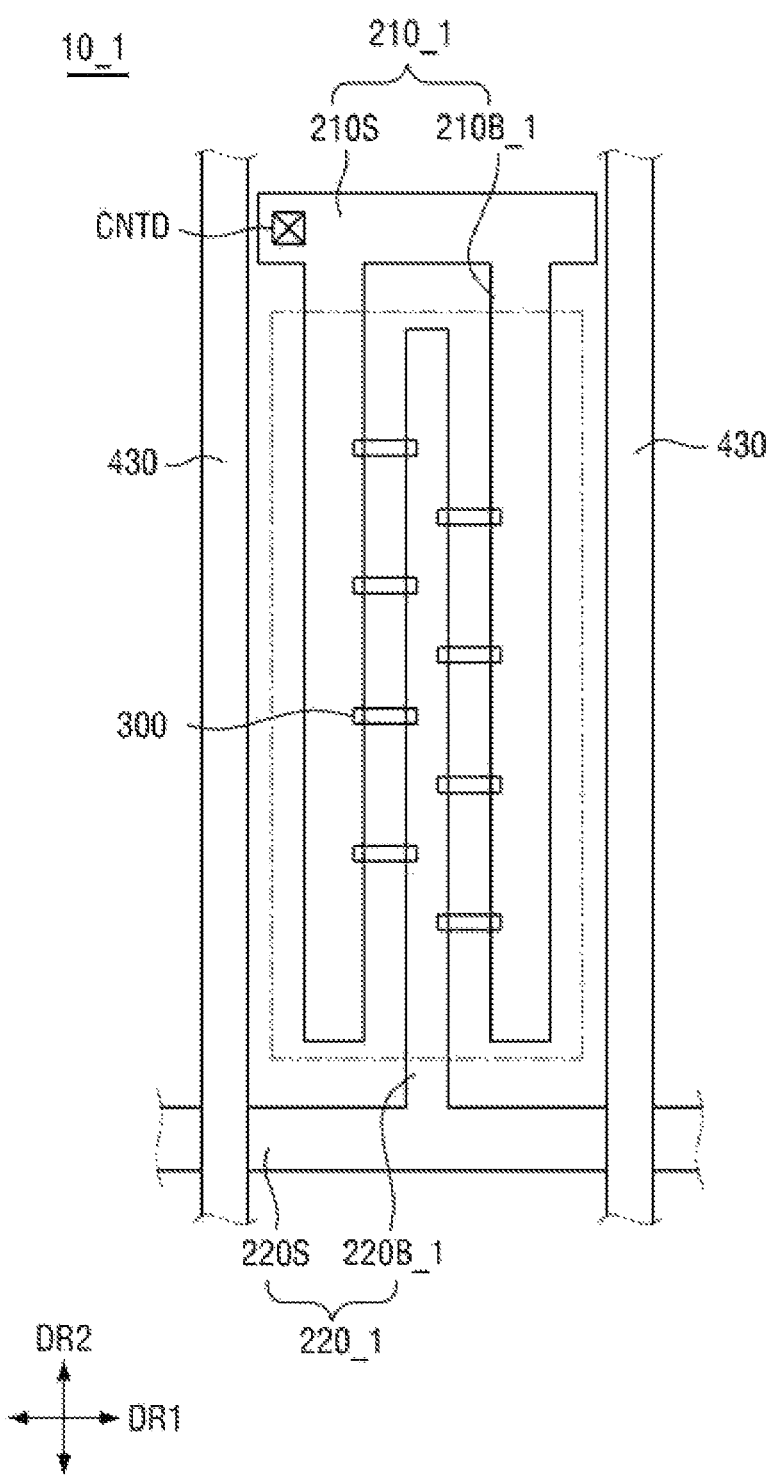
FIG. 9 is a plan view illustrating a sub-pixel of a display device according to still another embodiment.
Figure 10:
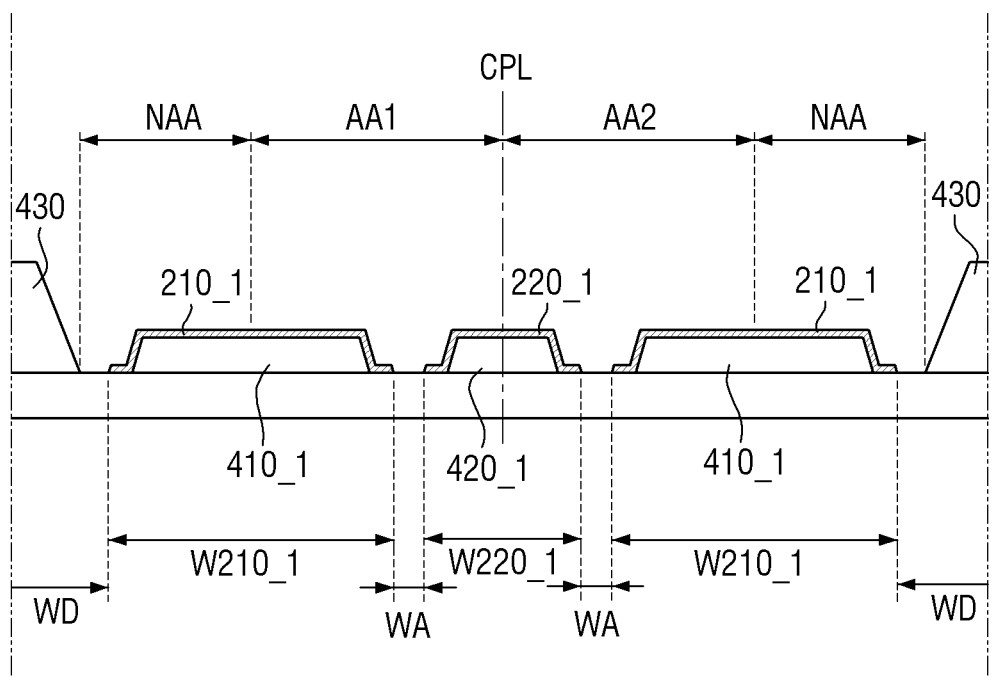
FIG. 10 is a schematic cross-sectional view taken across the sub-pixel of the display device of FIG. 9.

FIG. 9 is a schematic plan view illustrating a sub-pixel of a display device according to still another embodiment. FIG. 10 is a schematic cross-sectional view taken across the sub-pixel of the display device of FIG. 9.

Referring to FIGS. 9 and 10, a display device 10_1 according to an embodiment may have an inner electrode having a width less than that of an outer electrode thereof. For example, a second width W220_1 of a second electrode 220_1, which is an inner electrode, may be less than a first width W210_1 of a first electrode 210_1, which is an outer electrode. The display device 10_1 is different from the display device 10 of FIG. 6 at least in that the width of the inner electrode is less than that of the outer electrode. Hereinafter, repetitive descriptions will be omitted and a description will be made to focus on differences.

Each sub-pixel PXn of the display device 10_1 may have a constant width. For example, a separation distance between outer banks 430 is constant, and a first separation distance WD, which is a separation distance between the outer electrode and the outer bank 430, may be adjusted by adjusting a width of each of the first electrode 210_1 and the second electrode 220_1. The first electrode 210_1 may include a first electrode stem portion 210S and a first electrode branch portion 210B_1. As shown in the drawing, the first width W210_1 of the first electrode 210_1, which is the outer electrode, may be greater than the second width W220_1 of the second electrode 220_1, which is the inner electrode. However, the first electrode 210_1 and the second electrode 220_1 may satisfy Equation 1 as in FIG. 6. Here, "WE" may be the second width W220_1 of the second electrode 220_1, which is the inner electrode. The first and second inner banks 410_1 and 420_1 may be formed as shown in FIG. 10.

As described above, since each sub-pixel PXn of the display device 10_1 has a constant width, by adjusting the width of the inner electrode or the outer electrode, the first separation distance WD between the outer electrode and the outer bank 430 may be adjusted, and furthermore, a width of each of a non-alignment region NAA and alignment regions AA1 and AA2 may be adjusted. The second separation distance WA, in which light-emitting elements 300 are disposed, between the first electrode 210 and the second electrode 220, or between the inner electrode and the outer electrode is constant. The second separation distance WA may be less than a length h of the light-emitting element 300 so that both end portions of the light-emitting element 300 may be disposed on the first electrode 210 and the second electrode 220, respectively. Accordingly, in the display device 10 according to an embodiment, a greater number of light-emitting elements 300 may be disposed in the alignment regions AA1 and AA2 by adjusting the width of the inner electrode or the outer electrode, or the width of the first electrode 210 or the second electrode 220.

Hereinafter, a display device 10 according to various embodiments will be described with reference to other drawings.

Figure 11:
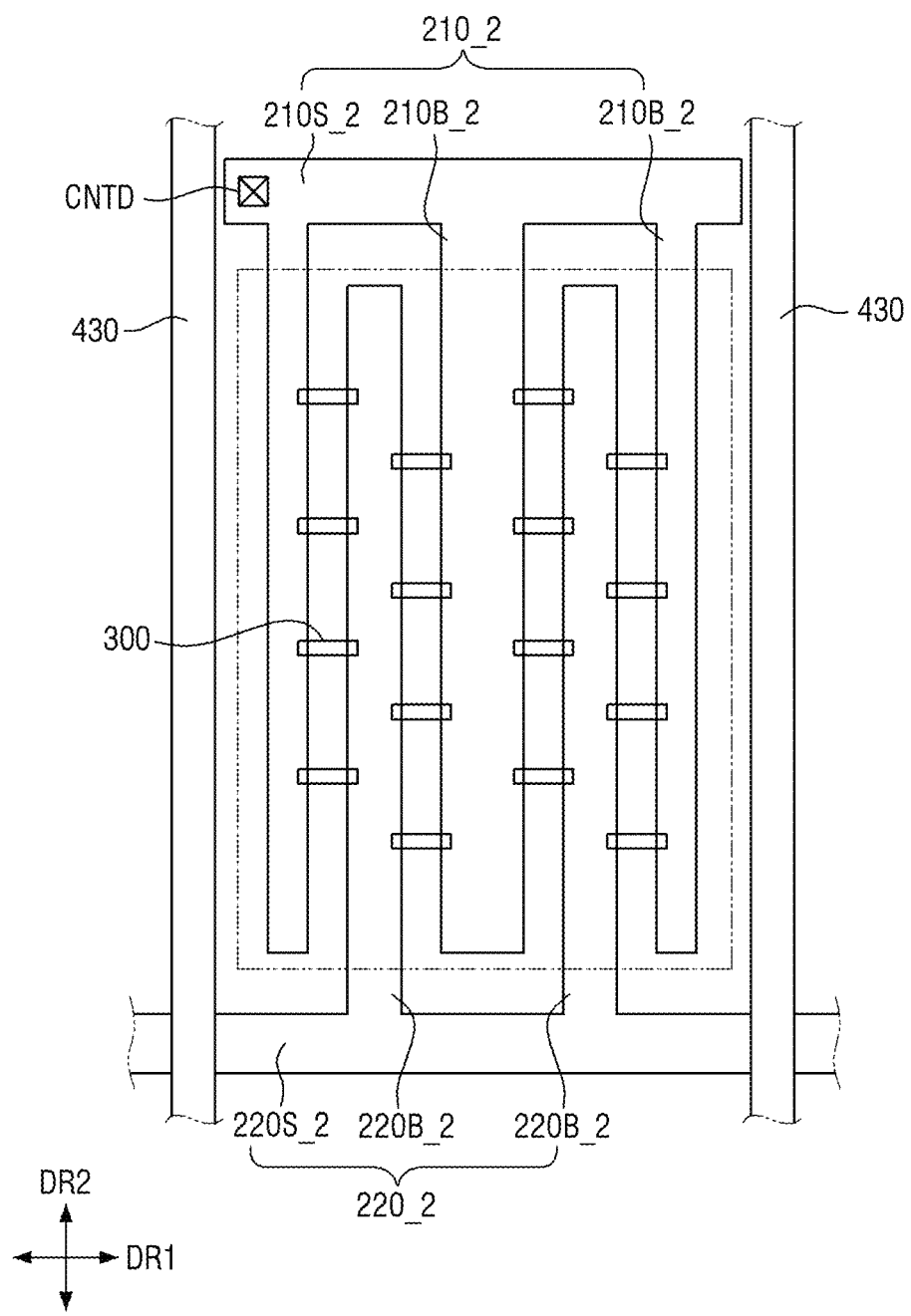
FIG. 11 is a plan view illustrating a sub-pixel of a display device according to yet another embodiment.
Figure 12:
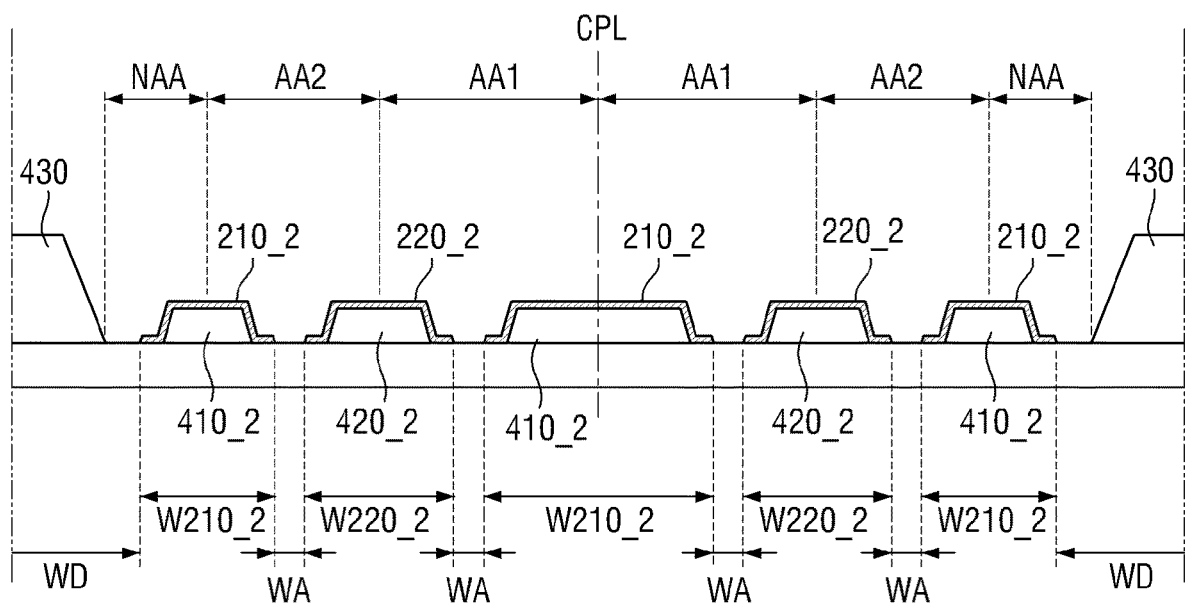
FIG. 12 is a schematic cross-sectional view taken across the sub-pixel of the display device of FIG. 11.

FIG. 11 is a schematic plan view illustrating a sub-pixel of a display device according to yet another embodiment. FIG. 12 is a schematic cross-sectional view taken across the sub-pixel of the display device of FIG. 11.

Referring to FIGS. 11 and 12, a display device 10_2 according to an embodiment may include a greater number of first electrodes 210_2 and a greater number of second electrodes 220_2. The display device 10_2 of FIGS. 11 and 12 includes three first electrodes 210_2 and two second electrodes 220_2 for each sub-pixel PXn, and the three first electrodes 210_2 and the two second electrodes 220_2 may be alternately disposed. As another example, the display device 10_2 may include a first electrode stem portion 210S_2, three first electrode branch portions 210B_2 branched from the first electrode stem portion 210S_2, a second electrode stem portion 220S_2, and two second electrode branch portions 220B_2 branched from the second electrode stem portion 220S_2. The display device 10_2 according to the embodiment is different from the display device 10 of FIG. 6 at least in that the first electrode 210_2 and the second electrode 220_2 or the first electrode branch portion 210B_2 and the second electrode branch portion 220B_2 disposed in each sub-pixel PXn are different. The first and second banks 410_2 and 420_2 may be formed as shown in FIG. 12. Hereinafter, repetitive descriptions will be omitted, and a description will be made to focus on differences.

The display device 10_2 of FIGS. 11 and 12 includes a greater number of first electrodes 210_2 and a greater number of second electrodes 220_2. Outer electrodes each facing an outer bank 430 may be the first electrodes 210_2, and inner electrodes may be two second electrodes 220_2 and a first electrode 210_2. Even in the display device 10_2 of FIGS. 11 and 12, a non-alignment region NAA may be located between the outer electrode and the outer bank 430 as in FIG. 6. However, a greater number of alignment regions AA1 and AA2 may be located between the outer electrodes and the inner electrodes. In an embodiment, light-emitting elements 300 may be disposed even between inner electrodes, and the alignment regions AA1 and AA2 may include a first alignment region AA1 between the inner electrodes and a second alignment region AA2 between the inner electrode and the outer electrode. A pixel center line CPL may be located collinear with a central portion of a first electrode 210_2 among the inner electrodes.

The first alignment region AA1, the second alignment region AA2, and the non-alignment region NAA are sequentially located on a side of the pixel center line CPL, and may also be located on the other side of the pixel center line CPL. As described above, a width of the inner electrode may be greater than a width of the outer electrode, and Equation 1 above may be satisfied. Accordingly, a width of each of the alignment regions AA1 and AA2 may be greater than a width of the non-alignment region NAA.

According to an embodiment, the inner electrodes may have different widths. The inner electrodes may include a first inner electrode, for example, the first electrode 210_2 whose central portion is located collinear with the pixel center line CPL, and second inner electrodes, for example, the second electrodes 220_2 that are respectively spaced apart from both sides of the first electrode 210_2. The first electrode 210_2 and the second electrode 220_2 may have different widths. Here, a width W220_2 of the second electrode 220_2, which is the inner electrode, may be less than a width W210_2 of the first electrode 210_2, which is the inner electrode, but may be greater than the width of the outer electrode. For example, the width of each of the inner electrodes and the outer electrodes may decrease toward the outer bank 430 from the pixel center line CPL.

Accordingly, the width of the first alignment region AA1 may be greater than the width of the second alignment region AA2. According to an embodiment, a separation distance between the outer bank 430 and the first electrode 210_2, which is the outer electrode, for example, a first separation distance WD may be less than a separation distance between the central portion of the first electrode 210_2, which is the outer electrode, and a central portion of the second electrode 220_2. The width of the second alignment region AA2 may be less than that of the first alignment region AA1, but may be greater than that of the non-alignment region NAA.

In case that a greater number of electrodes are disposed in each sub-pixel PXn, the number of the alignment regions AA1 and AA2 in which the light-emitting elements 300 are disposed may be increased. As described above, in case that the non-alignment region NAA between the outer electrode and the outer bank 430 is wider than each of the alignment regions AA1 and AA2, among the light-emitting elements 300 dispersed in ink S, the number of the light-emitting elements 300 located in the alignment regions AA1 and AA2 may be reduced. The distribution of the light-emitting elements 300 disposed for each of the alignment regions AA1 and AA2 may vary depending on the separation distance from the non-alignment region NAA. In the ink S, a greater number of the light-emitting elements 300 are located in the non-alignment region NAA, and thus a greater number of light-emitting elements 300 may be disposed in the second alignment region AA2 adjacent to the non-alignment region NAA than in the first alignment region AA1.

In the display device 10_2 according to an embodiment, the width of the non-alignment region NAA may be minimized by adjusting the width of each of the inner electrode and the outer electrode so that a greater number of light-emitting elements 300 may be disposed in the alignment regions AA1 and AA2. Furthermore, the light-emitting element 300 may be uniformly disposed in the first alignment region AA1 and the second alignment region AA2.

Further, as described above, the width of the inner electrode may be less than the width of the outer electrode.

Figure 13:
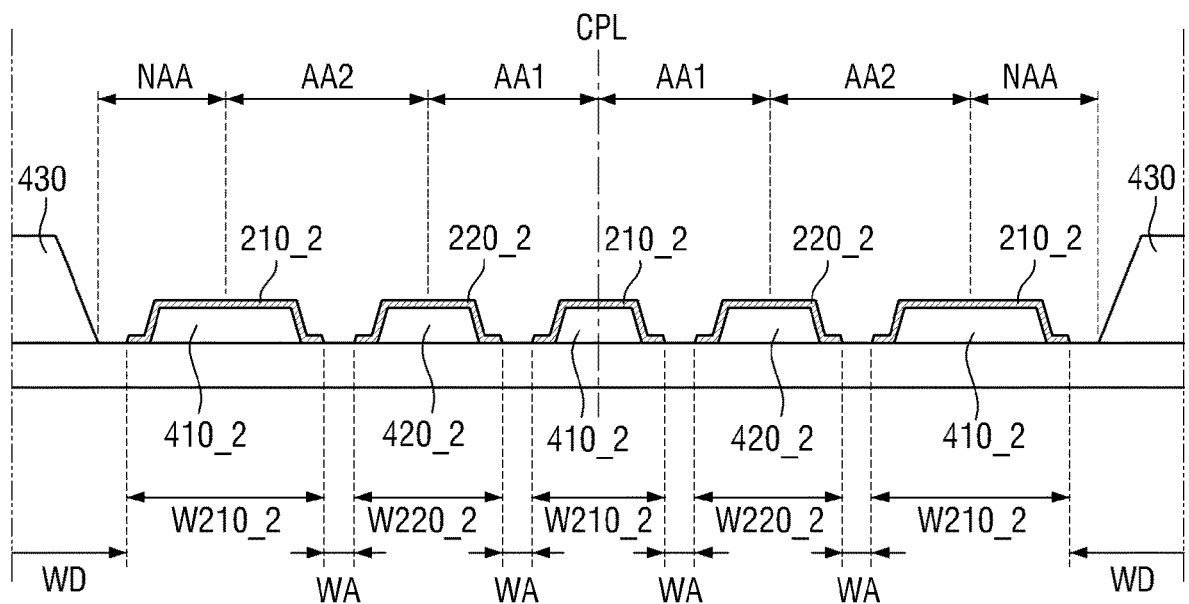
FIG. 13 is a schematic cross-sectional view taken across a sub-pixel according to another embodiment of the display device of FIG. 11.

FIG. 13 is a schematic cross-sectional view taken across a sub-pixel according to another embodiment of the display device of FIG. 11.

Referring to FIG. 13, the display device 10_2 may have the inner electrode having a width less than that of the outer electrode thereof. A width of the display device 10_2 including the inner electrodes may decrease from the outer electrode toward the inner electrode. The display device 10_2 of FIG. 13 is different from the display device 10_2 of FIG. 12 at least in that the width relationship between the inner electrode and the outer electrode is opposite to that in the display device 10_2 of FIG. 12. The display device 10_2 of FIG. 13 is the same as the display device 10_2 of FIG. 12 to which the display device 10 of FIG. 9 is added. Therefore, detailed descriptions thereof will be omitted.

In the display devices 10 and 10_2 of FIGS. 5 and 11, each sub-pixel PXn may include odd numbers of electrodes 210 and 220. However, the disclosure is not limited thereto, and in some cases, each sub-pixel PXn may include even numbers of electrodes.

Figure 14:
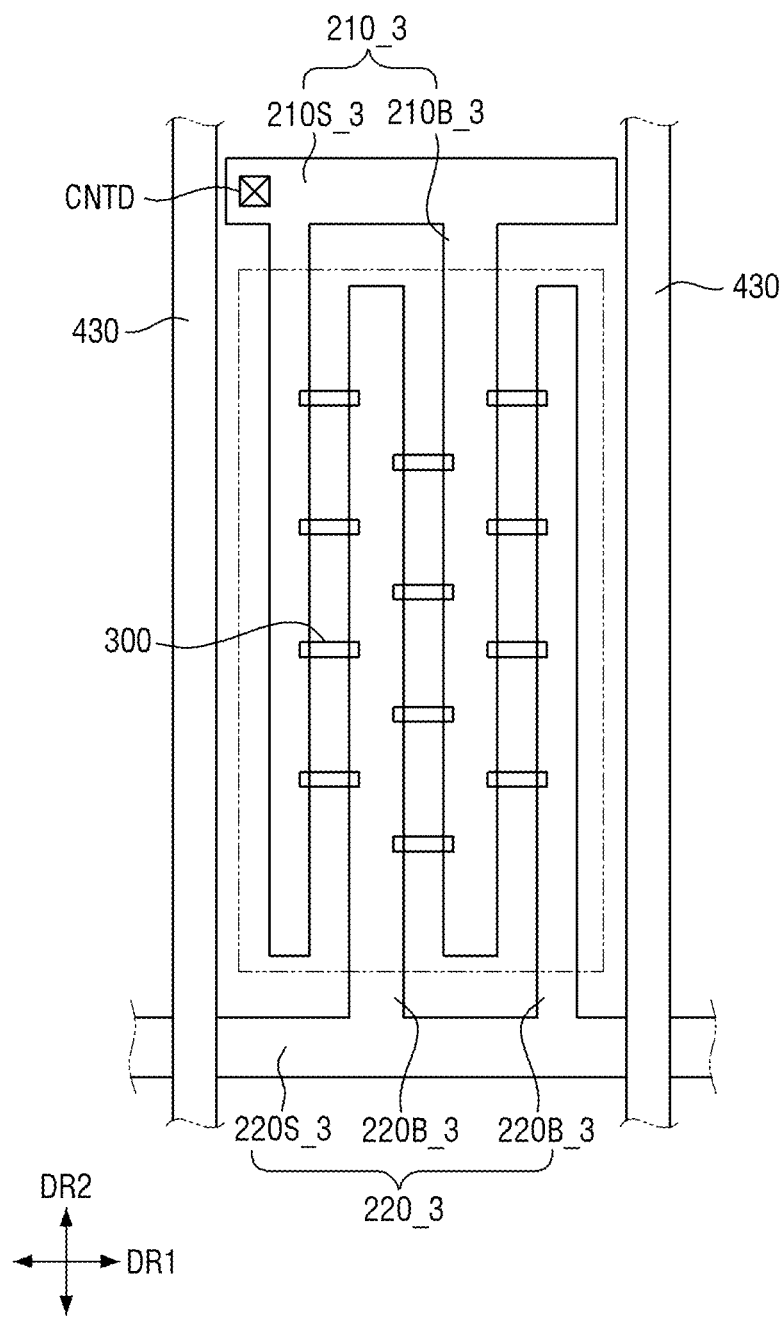
FIG. 14 is a plan view illustrating a sub-pixel of a display device according to yet another embodiment.
Figure 15:
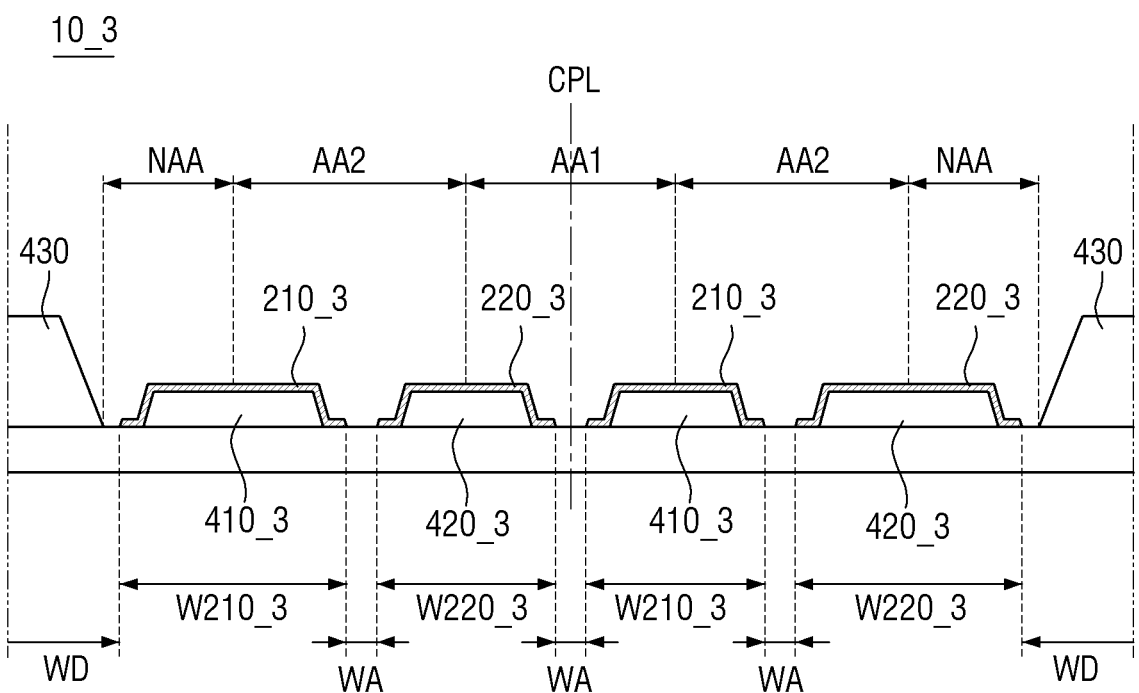
FIG. 15 is a schematic cross-sectional view taken across the sub-pixel of the display device of FIG. 14.

FIG. 14 is a schematic plan view illustrating a sub-pixel of a display device according to yet another embodiment. FIG. 15 is a schematic cross-sectional view taken across the sub-pixel of the display device of FIG. 14.

Referring to FIGS. 14 and 15, a display device 10_3 according to an embodiment includes two first electrodes 210_3 and two second electrodes 220_3 for each sub-pixel PXn, and the two first electrodes 210_3 and the two second electrodes 220_3 may be alternately disposed. As another example, the display device 10_3 may include a first electrode stem portion 210S_3, two first electrode branch portions 210B_3 branched from the first electrode stem portion 210S_3, a second electrode stem portion 220S_3, and two second electrode branch portions 220B_3 branched from the second electrode stem portion 220S_3. The display device 10_3 according to the embodiment is different from the display device 10 of FIG. 6 at least in that the first electrode 210_3 and the second electrode 220_3 or the first electrode branch portion 210B_3 and the second electrode branch portion 220B_3 that are disposed in each sub-pixel PXn are different. The first and second banks 410_3 and 420_3 may be formed as shown in FIG. 15. Hereinafter, repetitive descriptions will be omitted, and a description will be made to focus on differences.

The display device 10_3 of FIGS. 14 and 15 includes a greater number of first electrodes 210_3 and a greater number of second electrodes 220_3. An outer electrode, which faces an outer bank 430, and an inner electrode may be a first electrode 210_3 and a second electrode 220_3, respectively. Even in the display device 10_3 of FIGS. 14 and 15, a non-alignment region NAA may be located between the outer electrode and the outer bank 430 as in FIG. 6. However, a greater number of alignment regions AA1 and AA2 may be located between the outer electrodes and the inner electrodes. In an embodiment, light-emitting elements 300 may be disposed even between inner electrodes, and the alignment regions AA1 and AA2 may include a first alignment region AA1 between the inner electrodes and a second alignment region AA2 between the inner electrode and the outer electrode.

According to an embodiment, the inner electrodes include a first inner electrode and a second inner electrode, which may be spaced apart from each other based on a pixel center line CPL. For example, the inner electrodes may be a first electrode 210_3 and a second electrode 220_3 spaced apart from each other based on the pixel center line CPL. The outer electrodes may be the other first electrode 210_3 and the other second electrode 220_3. The first electrode 210_3 and the second electrode 220_3, which are the inner electrodes, may be the same and may have widths smaller than those of the other first electrode 210_3 and the other second electrode 220_3, which are the outer electrodes. As shown in the drawing, based on the pixel center line CPL, the first electrode 210_3, which is the outer electrode, may be disposed on the second electrode 220_3, which is the inner electrode, and the outer bank 430. A width of the first electrode 210_3, which is the outer electrode, may be less than that of the second electrode 220_3, which is the inner electrode.

The first alignment region AA1 may be located to overlap the pixel center line CPL, and the second alignment regions AA2 may be located at a side and the other side of the first alignment region AA1. A portion of the first alignment region AA1, the second alignment region AA2, and the non-alignment region NAA may be sequentially located on a side of the pixel center line CPL, and may also be located on the other side of the pixel center line CPL. As described above, a width of the inner electrode may be greater than a width of the outer electrode, and Equation 1 above may be satisfied. Accordingly, a width of each of the alignment regions AA1 and AA2 may be greater than a width of the non-alignment region NAA.

According to an embodiment, the inner electrodes may have different widths. The inner electrodes may include the first inner electrode, for example, the first electrode 210_3 and the second inner electrode, for example, the second electrode 220_3, which are spaced apart from each other based on the pixel center line CPL, and the first electrode 210_3 and the second electrode 220_3 may have the same width. Here, a width W210_3 of the first electrode 210_3, which is the inner electrode, is the same as a width W220_3 of the second electrode 220_2, which is the inner electrode, and may be smaller than the width of the outer electrode. For example, the width of each of the inner electrodes and the outer electrodes may decrease toward the outer bank 430 from the pixel center line CPL.

Accordingly, the width of the first alignment region AA1 may be greater than the width of the second alignment region AA2. According to an embodiment, a separation distance between the outer bank 430 and the first electrode 210_3 or the second electrode 220_3, which is the outer electrode, for example, a first separation distance WD, may be less than a separation distance between a central portion of the first electrode 210_3, which is the outer electrode, and a central portion of the second electrode 220_3. The width of the second alignment region AA2 may be less than that of the first alignment region AA1, but may be greater than that of the non-alignment region NAA.

The display device 10_3 of FIG. 15 may be different from the display device 10_2 of FIG. 12 at least in that the number of the electrodes 210_3 and 220_3 is an even number. In the display device 10_3 of FIG. 15, the pixel center line CPL may not overlap the electrodes 210 and 220, and the inner electrodes may be spaced from each other based on the pixel center line CPL. Descriptions of other structures and arrangements may be substantially identical or similar to those described above with reference to FIG. 11, and thus detailed descriptions thereof will be omitted.

Figure 16:
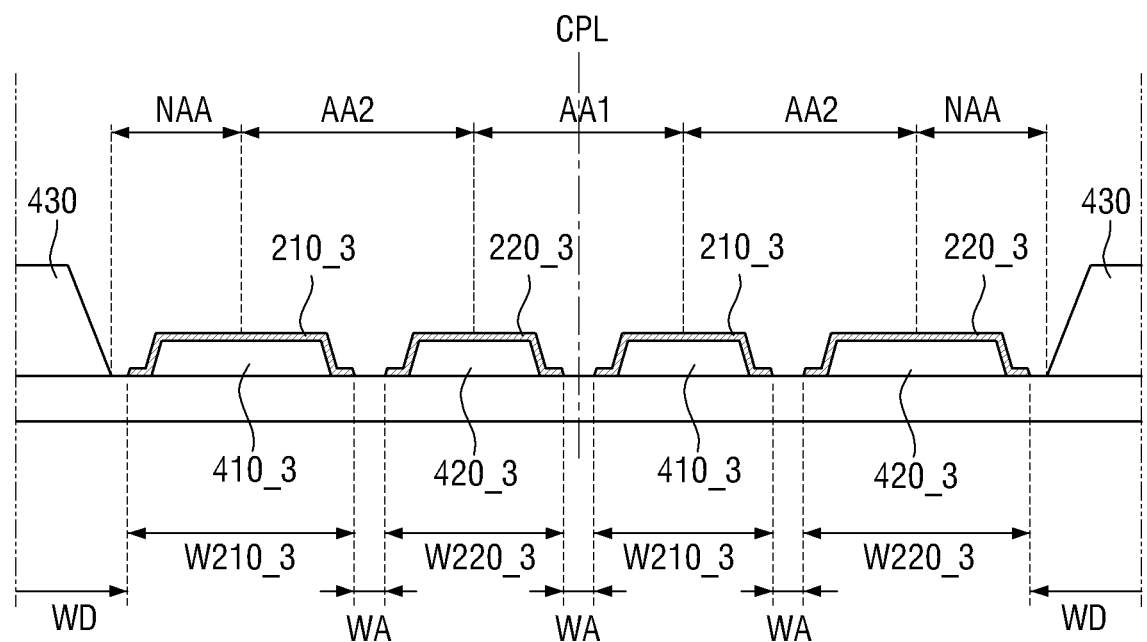
FIG. 16 is a schematic cross-sectional view taken across a sub-pixel according to another embodiment of the display device of FIG. 14.

FIG. 16 is a schematic cross-sectional view taken across a sub-pixel according to another embodiment of the display device of FIG. 14. Referring to FIG. 16, the display device 10_3 may have the inner electrode having a width less than that of the outer electrode thereof. A width of the display device 10_3 including the inner electrodes may decrease from the outer electrode toward the inner electrode. The display device 10_3 of FIG. 16 is different from the display device 10_3 of FIG. 15 at least in that the width relationship between the inner electrode and the outer electrode is opposite to that in the display device 10_3 of FIG. 15. The display device 10_3 of FIG. 16 is the same as the display device 10_3 of FIG. 15 to which the display device 10 of FIG. 9 is added. Therefore, detailed descriptions thereof will be omitted.

In the display device 10, the electrode stem portions 210S and 220S of the first electrode 210 and the second electrode 220 may be omitted.

Figure 17:
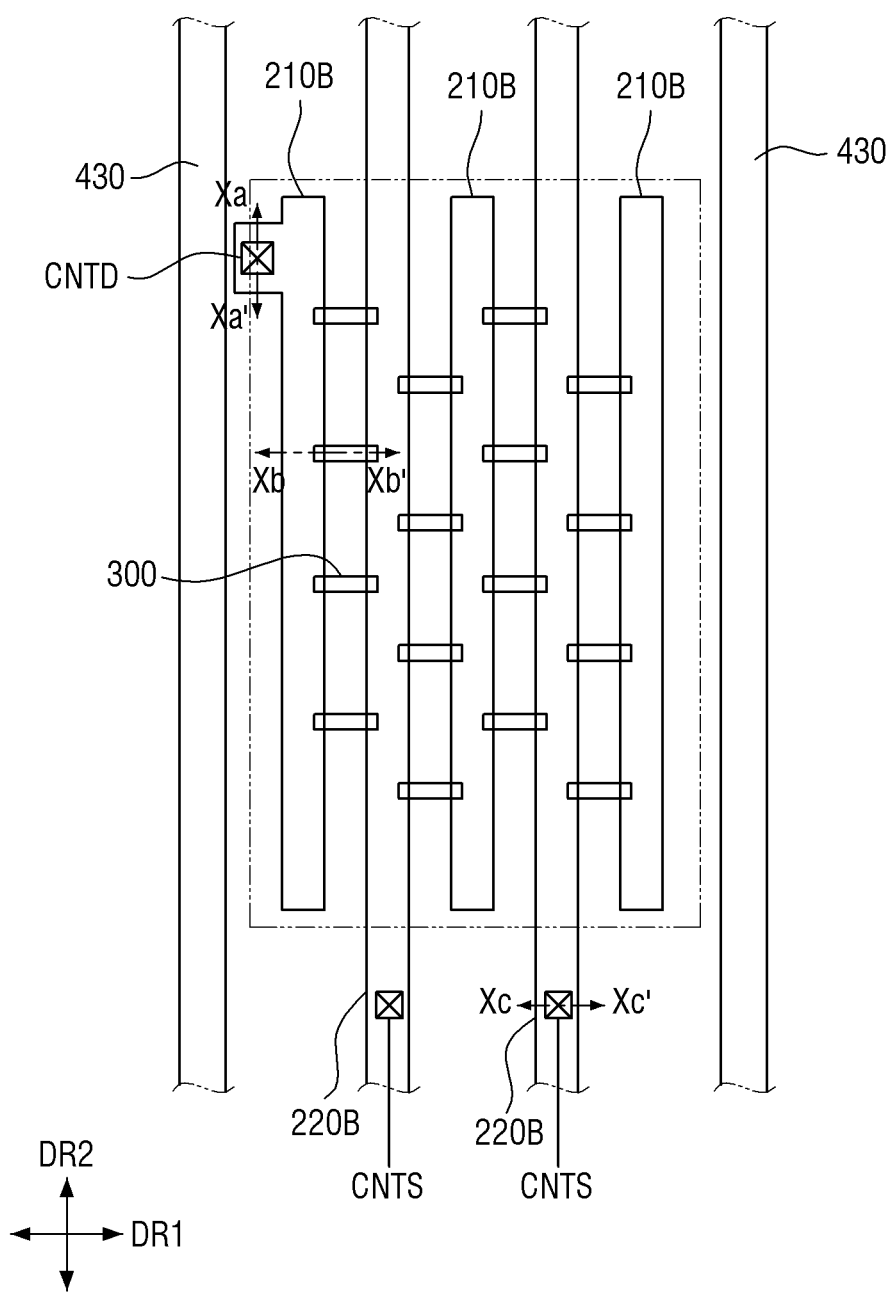
FIGS. 17 and 18 are schematic plan views each illustrating a sub-pixel of a display device according to yet another embodiment.
Figure 18:
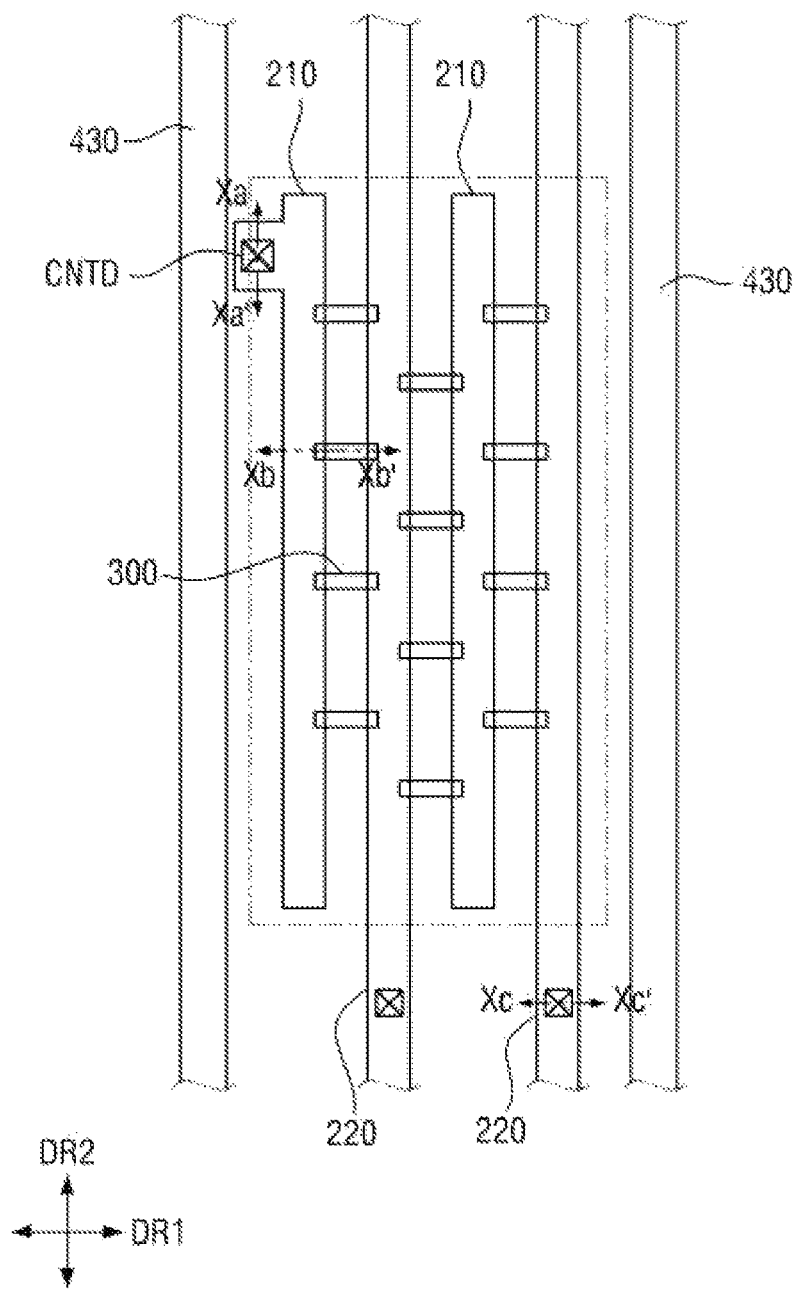

FIGS. 17 and 18 are schematic plan views each illustrating a sub-pixel of a display device according to yet another embodiment.

Referring to FIGS. 17 and 18, in a display device 10, a first electrode 210 and a second electrode 220 may extend in a direction, for example, the second direction DR2. For example, in the first electrode 210 and the second electrode 220, electrode stem portions 210S and 220S extending in the first direction DR1 may be omitted. The display devices 10 according to the embodiments are different from the display device 10 of FIG. 2 at least in that the electrode stem portions 210S and 220S are omitted. Cross sections taken along lines Xa-Xa', Xb-Xb', and Xc-Xc' of FIG. 17 may be substantially the same as those in FIG. 3. Hereinafter, repetitive descriptions will be omitted, and a description will be made to focus on differences.

First, as shown in FIG. 17, first electrodes 210 and second electrodes 220 may extend in the second direction DR2 in each sub-pixel PXn. An outer bank 430 may also extend in the second direction DR2. The second electrode 220 and the outer bank 430 may extend to another sub-pixel PXn that is adjacent in the second direction DR2. Thus, each of the sub-pixels PXn that are adjacent in the second direction DR2 may receive the a same electrical signal from the second electrode 220.

Unlike the display device 10 of FIG. 2, in the display device 10 of FIG. 17, a second electrode contact hole CNTS may be disposed in each of the second electrodes 220. The second electrode 220 may be electrically connected to a power electrode 162 of a circuit element layer PAL through the second electrode contact hole CNTS that is located in each sub-pixel PXn.

On the other hand, the first electrode 210 may extend in the second direction DR2 and may be terminated at a boundary of each sub-pixel PXn. The sub-pixels PXn that are adjacent in the second direction DR2 may include the first electrodes 210 spaced apart from each other, and the sub-pixels PXn may receive different electrical signals through first electrode contact holes CNTD. A shape of the first electrode 210 may be formed by extending in the second direction DR2 and then disconnected at a boundary between adjacent sub-pixels PXn during the process of manufacturing the display device 10.

The outer bank 430 may be disposed at the boundary between adjacent sub-pixels PXn in the first direction DR1 and may extend in the second direction DR2. Although not shown in the drawing, the outer bank 430 may be disposed at the boundary between adjacent sub-pixels PXn in the second direction DR2 and may extend in the first direction DR1. A description of the outer bank 430 is the same as that given above with reference to FIG. 2.

In the drawing, it is illustrated that three first electrodes 210 and two second electrodes 220 are alternately disposed and spaced apart from each other. However, the disclosure is not limited thereto, and in the display device 10, some electrodes may be omitted, or a greater number of electrodes may be disposed.

Next, in the display device 10 of FIG. 18, two first electrodes 210 and two second electrodes 220 extending in the second direction DR2 may be disposed in a sub-pixel PXn. The display device 10 according to the embodiment is different from the display device 10 of FIG. 17 at least in that a first electrode 210 is omitted. In this case, each of an inner electrode and an outer electrode may include a first electrode 210 and a second electrode 220. Each outer bank 430 may face a first electrode 210 and a second electrode 220. Detailed descriptions of the display device 10 of FIG. 18 may be substantially identical or similar to those described above with reference to FIGS. 14 and 17, and thus, a detailed description thereof will be omitted.

The structure of the light-emitting element 300 is not limited to that shown in FIG. 5 and may have another structure.

Figure 19:
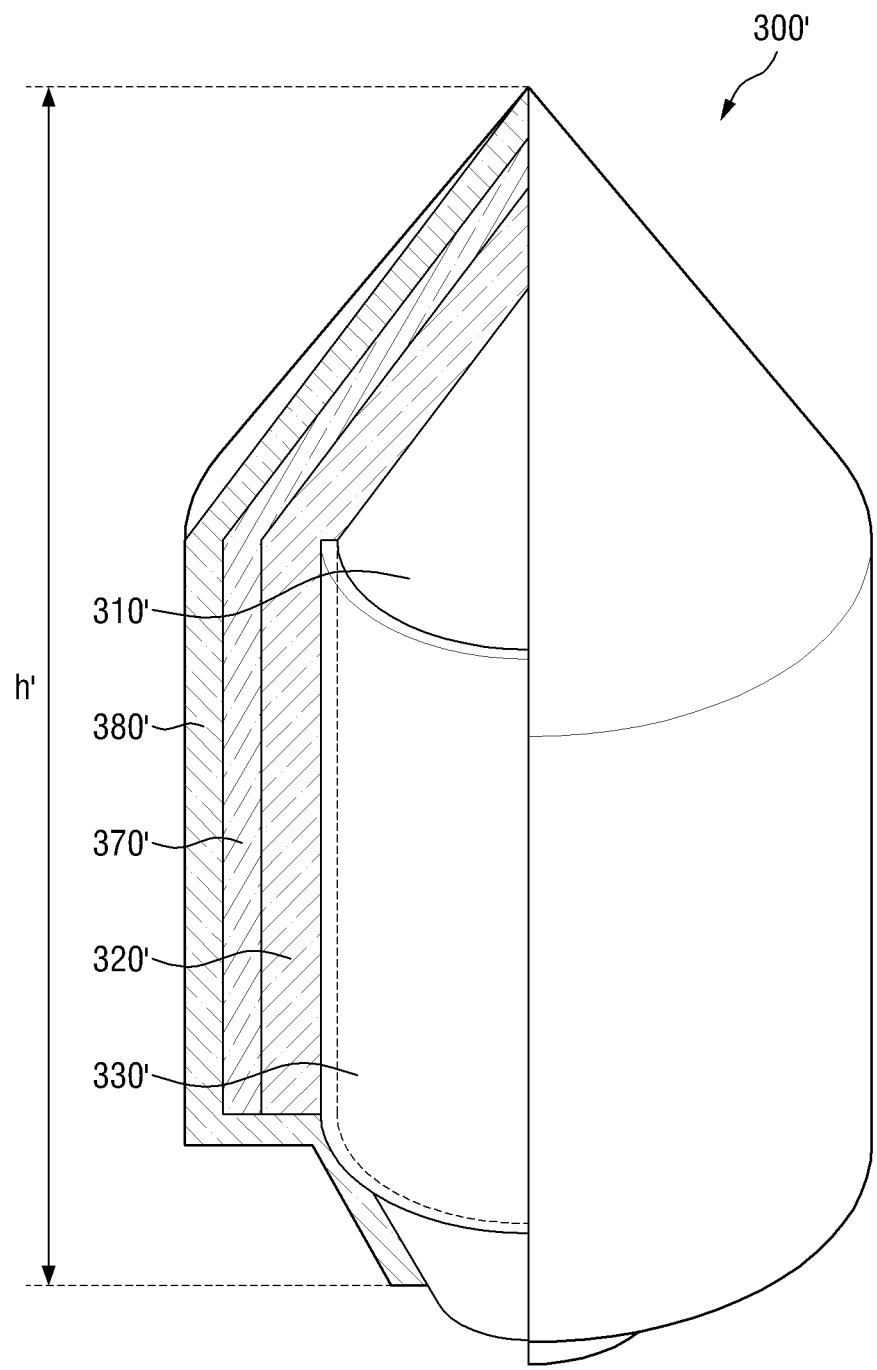
FIG. 19 is a schematic view of a light-emitting element according to another embodiment.

FIG. 19 is a schematic view of a light-emitting element according to another embodiment.

Referring to FIG. 19, a light-emitting element 300' may extend in a direction and have a partially inclined side surface. For example, the light-emitting element 300' according to an embodiment may have a partially conical shape.

The light-emitting element 300' may be formed such that layers are stacked not in a direction and each of the layers surrounds an outer surface of another layer. The light-emitting element 300' of FIG. 19 may be formed such that semiconductor layers surround at least a portion of an outer surface of another layer. The light-emitting element 300' may include a semiconductor core of which at least a partial region extends in a direction and an insulating film 380' formed to surround the semiconductor core. The semiconductor core may include a first semiconductor layer 310', an active layer 330', a second semiconductor layer 320', and an electrode layer 370'. In an embodiment, the light-emitting element 300 may have a length h' ranging from about 1 μm to about 10 μm. The light-emitting element 300' of FIG. 19 may be different from the light-emitting element 300 of FIG. 5 at least in that the shape of each layer thereof is partially different. Hereinafter, repetitive descriptions thereof will be omitted, and differences will be described.

According to an embodiment, the first semiconductor layer 310' may extend in a direction and have both end portions formed to be inclined toward a central portion. The first semiconductor layer 310' of FIG. 19 may have a shape in which a rod-shaped or cylindrical main body and end portions having inclined side surfaces on upper and lower portions of the main body are formed. An upper end portion of the main body may have a slope that is steeper than a slope of a lower end portion thereof.

The active layer 330' is disposed to surround an outer surface of the main body of the first semiconductor layer 310'. The active layer 330' may have an annular shape extending in a direction. The active layer 330' may not be formed on upper and lower end portions of the first semiconductor layer 310'. The active layer 330' may be formed only on a non-inclined side surface of the first semiconductor layer 310'. However, the disclosure is not limited thereto. Accordingly, light emitted from the active layer 330' may be emitted to not only both end portions of the light-emitting element 300' in a lengthwise direction but also both side surfaces thereof based on the lengthwise direction. When compared with the light-emitting element 300 of FIG. 5, the light-emitting element 300' of FIG. 19 may include the active layer 330' having a larger area, thereby emitting a greater amount of light.

The second semiconductor layer 320' is disposed to surround an outer surface of the active layer 330' and the upper end portion of the first semiconductor layer 310'. The second semiconductor layer 320' may include an annular main body extending in a direction and an upper end portion having a side surface formed to be inclined. For example, the second semiconductor layer 320' may directly contact a parallel side surface of the active layer 330' and the inclined upper end portion of the first semiconductor layer 310'. However, the second semiconductor layer 320' is not formed on the lower end portion of the first semiconductor layer 310'.

The electrode layer 370' is disposed to surround an outer surface of the second semiconductor layer 320'. For example, a shape of the electrode layer 370' may be substantially the same as that of the second semiconductor layer 320'. For example, the electrode layer 370' may fully contact the outer surface of the second semiconductor layer 320'.

The insulating film 380' may be disposed to surround outer surfaces of the electrode layer 370' and the first semiconductor layer 310'. The insulating film 380' may directly contact the electrode layer 370', the lower end portion of the first semiconductor layer 310', and exposed lower end portions of the active layer 330' and the second semiconductor layer 320'.

In concluding the detailed description, those skilled in the art will appreciate that many variations and modifications can be made to the embodiments without substantially departing from the principles of the disclosure. Therefore, the disclosed embodiments of the disclosure are used in a generic and descriptive sense only and not for purposes of limitation.

What is claimed is:

1. A display device comprising:
   at least one pixel;
   a first bank and a second bank that are disposed on a substrate and spaced apart from a center line of each of the at least one pixel;
   at least one first electrode and at least one second electrode spaced apart from each other between the first and second banks; and
   at least one light-emitting element disposed between the at least one first electrode and the at least one second electrode,
   wherein a width of the at least one first electrode and a width of the at least one second electrode are different from each other.

2. The display device of claim 1, wherein
   the at least one first electrode and the at least one second electrode are disposed between the first bank and the center line in each of the at least one pixel,
   the at least one first electrode is disposed between the at least one second electrode and the first bank, and
   the width of the at least one second electrode is greater than the width of the at least one first electrode.

3. The display device of claim 2, wherein a distance between a central portion of the at least one first electrode and the first bank is less than a distance between the central portion of the at least one first electrode and a central portion of the at least one second electrode.

4. The display device of claim 3, wherein the at least one pixel is defined by Inequality 1 below, $$WD < WA + WE/2 \qquad \text{[Inequality 1]}$$

where, WD is the first distance between the at least one first electrode and the first bank, WA is the second distance between the at least one first electrode and the at least one second electrode, and WE is the width of the at least one first electrode or the at least one second electrode.

5. The display device of claim 4, further comprising:
   a third electrode spaced apart from the at least one second electrode with respect to the center line in each of the at least one pixel, the at least one second electrode and the third electrode having a same width; and
   a fourth electrode disposed between the third electrode and the second bank and spaced apart from the third electrode, the at least one first electrode and the fourth electrode having a same width.

6. The display device of claim 1, wherein
   a central portion of the at least one second electrode is colinear with the center line in each of the at least one pixel substrate,
   the at least one first electrode is dis posed between the at least one second electrode and the first bank, and
   the width of the at least one second electrode is greater than the width of the at least one first electrode.

7. The display device of claim 6, wherein a distance between the first bank and a central portion of the at least one first electrode is less than a distance between the central portion of the at least one first electrode and the central portion of the at least one second electrode.

8. The display device of claim 1, wherein the second electrode is held at a different electrical potential than the first electrode by being electrically connected to a different voltage source than the first electrode.

9. The display device of claim 1, wherein
   each of the at least one light emitting element includes a first end electrically connected the first electrode and a second and opposite end electrically connected to the second electrode, wherein
   each of the at least one light emitting element being a light emitting diode that emits light due to a potential difference between the first electrode and the second electrode.

10. The display device of claim 1, wherein
    the first electrode is an anode of each of the at least one light emitting element, and
    the second electrode is a cathode of each of the at least one light emitting element.

11. The display device of claim 1, wherein
    each of the at least one pixel includes a plurality of discrete light emitting elements, and
    each of the plurality of light emitting elements being light emitting diodes.

12. A display device comprising:
    a plurality of pixels, wherein each of the plurality of pixels comprises:
    a plurality of banks each extending in a first direction and spaced apart from each other in a second direction different from the first direction;
    at least one first electrode extending in the first direction between the banks;
    at least one second electrode spaced apart from the at least one first electrode in the second direction; and
    at least one light-emitting element disposed between the at least one first electrode and the at least one second electrode, wherein
    a width of the at least one first electrode and a width of the at least one second electrode are different from each other, and
    a distance between a central portion of the at least one first electrode and a central portion of the at least one second electrode is greater than a distance between the at least one first electrode and a corresponding one of the plurality of banks.

13. The display device of claim 12, wherein
the at least one first electrode is spaced apart from sides of the at least one second electrode, and
the width of the at least one second electrode is greater than the width of the at least one first electrode.

14. The display device of claim 13, wherein a distance between the at least one first electrode and sides of the at least one second electrode is less than a length of the at least one light-emitting element.

15. An electronic device comprising:
at least one pixel;
a first bank and a second bank that are disposed on a substrate and spaced apart from a center line of each of the at least one pixel;
at least one first electrode and at least one second electrode spaced apart from each other between the first and second banks; and
at least one light-emitting element disposed between the at least one first electrode and the at least one second electrode,
wherein a width of the at least one first electrode and a width of the at least one second electrode are different from each other.

* * * * *